(12) United States Patent
Gudeman et al.

(10) Patent No.: US 9,953,787 B2
(45) Date of Patent: Apr. 24, 2018

(54) DUAL SUBSTRATE ELECTROSTATIC MEMS SWITCH WITH MULTIPLE HINGES AND METHOD OF MANUFACTURE

(71) Applicant: Innovative Micro Technology, Goleta, CA (US)

(72) Inventors: Christopher S. Gudeman, Lompoc, CA (US); Paul J. Rubel, Santa Barbara, CA (US); Marin Sigurdson, Goleta, CA (US)

(73) Assignee: Innovative Micro Technology, Goleta, CA (US)

( * ) Notice: Subject to any disclaimer, the term of this patent is extended or adjusted under 35 U.S.C. 154(b) by 89 days.

(21) Appl. No.: 15/060,630

(22) Filed: Mar. 4, 2016

(65) Prior Publication Data

US 2016/0268084 A1 Sep. 15, 2016

Related U.S. Application Data

(60) Provisional application No. 62/131,282, filed on Mar. 11, 2015.

(51) Int. Cl.
*H01H 59/00* (2006.01)
*B81B 7/00* (2006.01)
*B81C 1/00* (2006.01)
*H01H 49/00* (2006.01)
*H01H 1/00* (2006.01)

(52) U.S. Cl.
CPC ............ *H01H 59/0009* (2013.01); *B81B 7/00* (2013.01); *B81C 1/00341* (2013.01); *H01H 49/00* (2013.01); *B81B 2201/012* (2013.01); *H01H 2001/0084* (2013.01)

(58) Field of Classification Search
CPC ....... H01H 49/00; H01H 59/0009; B81B 7/00
USPC ............................................ 200/181; 29/622
See application file for complete search history.

(56) References Cited

U.S. PATENT DOCUMENTS

| | | | |
|---|---|---|---|
| 5,278,368 A | 1/1994 | Kasano et al. | |
| 6,384,353 B1* | 5/2002 | Huang | B81B 7/007 200/181 |
| 6,396,372 B1 | 5/2002 | Sakata et al. | |
| 6,486,425 B2 | 11/2002 | Seki | |
| 6,511,894 B2 | 1/2003 | Song | |
| 6,624,003 B1* | 9/2003 | Rice | B81B 7/007 438/106 |
| 6,903,637 B2* | 6/2005 | Miyazaki | B81B 7/007 200/181 |
| 7,119,943 B2 | 10/2006 | Nelson et al. | |

(Continued)

*Primary Examiner* — Edwin A. Leon
*Assistant Examiner* — Iman Malakooti
(74) *Attorney, Agent, or Firm* — Jaquelin K. Spong

(57) ABSTRACT

Systems and methods for forming an electrostatic MEMS switch include forming a movable cantilevered beam on a first substrate, forming the electrical contacts on a second substrate, and coupling the two substrates using a hermetic seal. Electrical access to the electrostatic MEMS switch may be made by forming vias through the thickness of the second substrate. The cantilevered beam may be formed by etching the perimeter shape in the device layer of an SOI substrate. An additional void may be formed in the movable beam such that it bends about an additional hinge line as a result of the additional void. This may give the beam and switch advantageous kinematic characteristics.

11 Claims, 30 Drawing Sheets

(56) References Cited

U.S. PATENT DOCUMENTS

2007/0236313 A1* 10/2007 Wallis ................ H01H 59/0009
                                                                    335/220

* cited by examiner

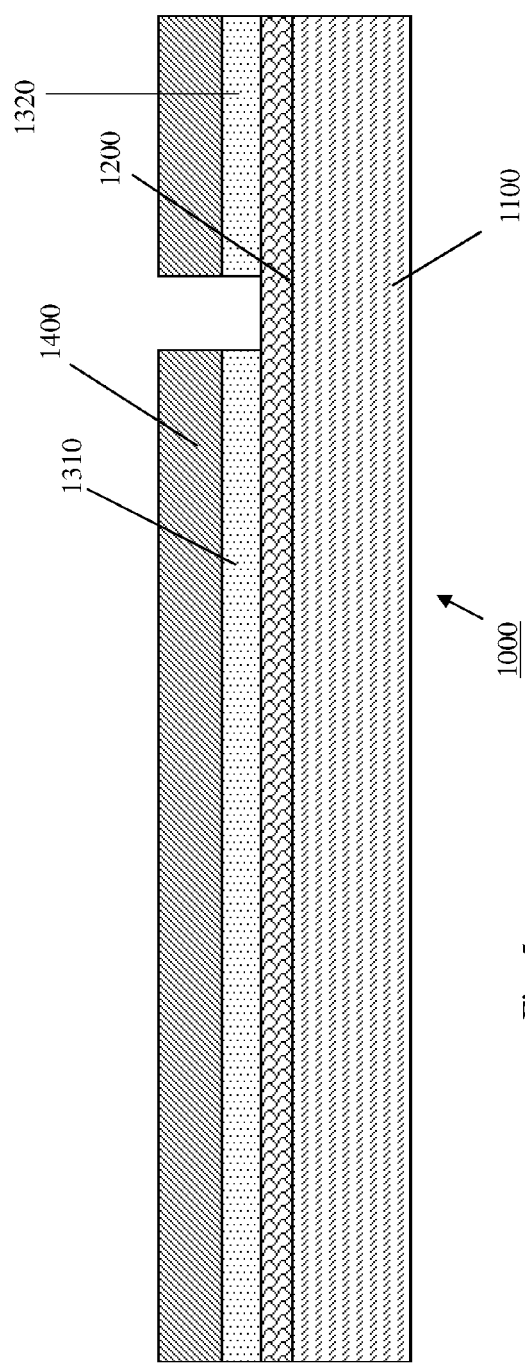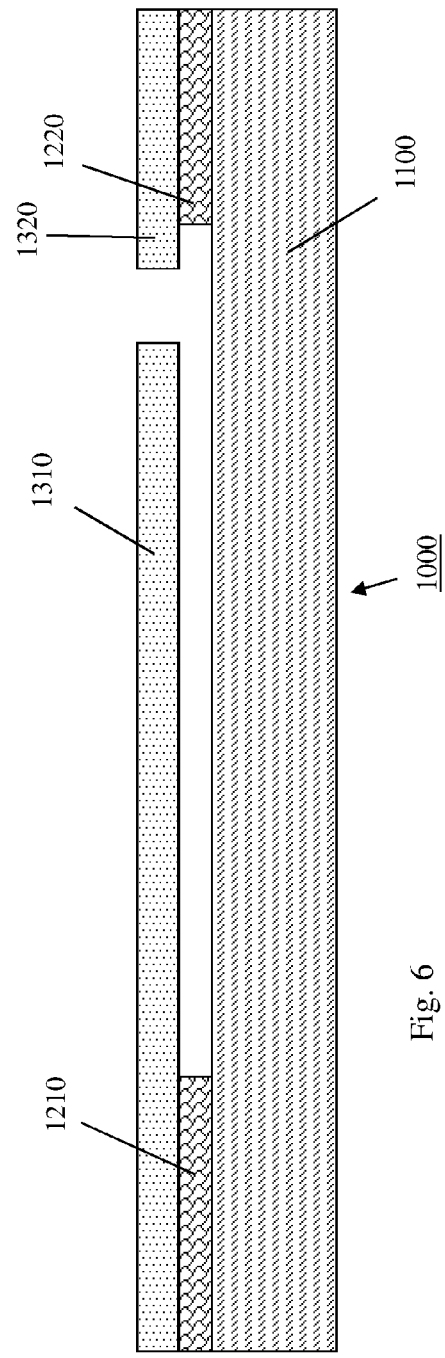
Fig. 5
Fig. 6

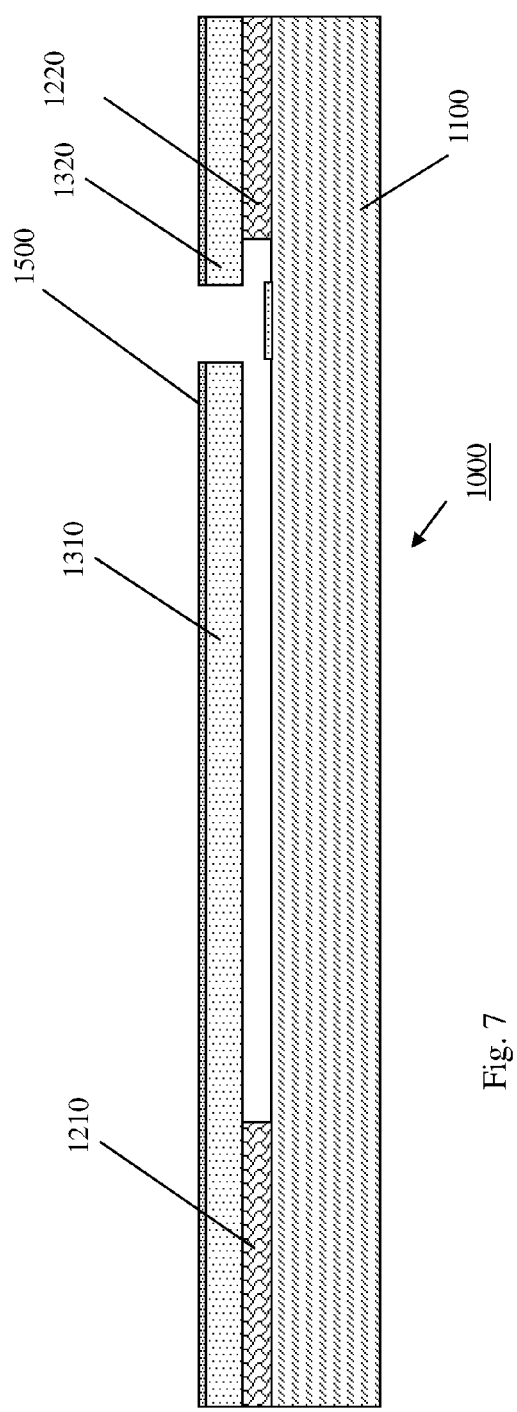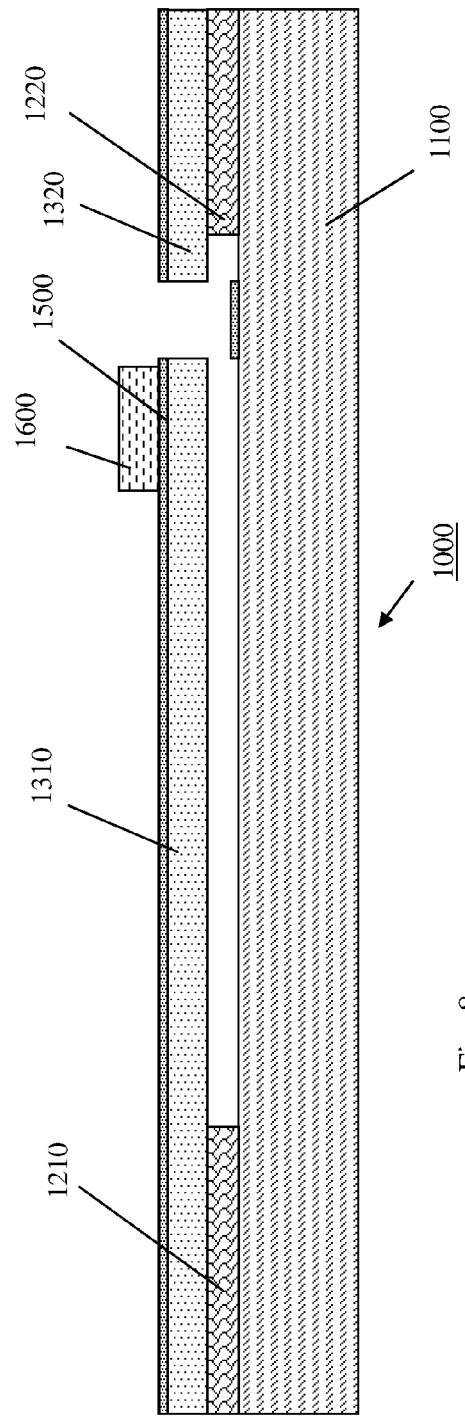

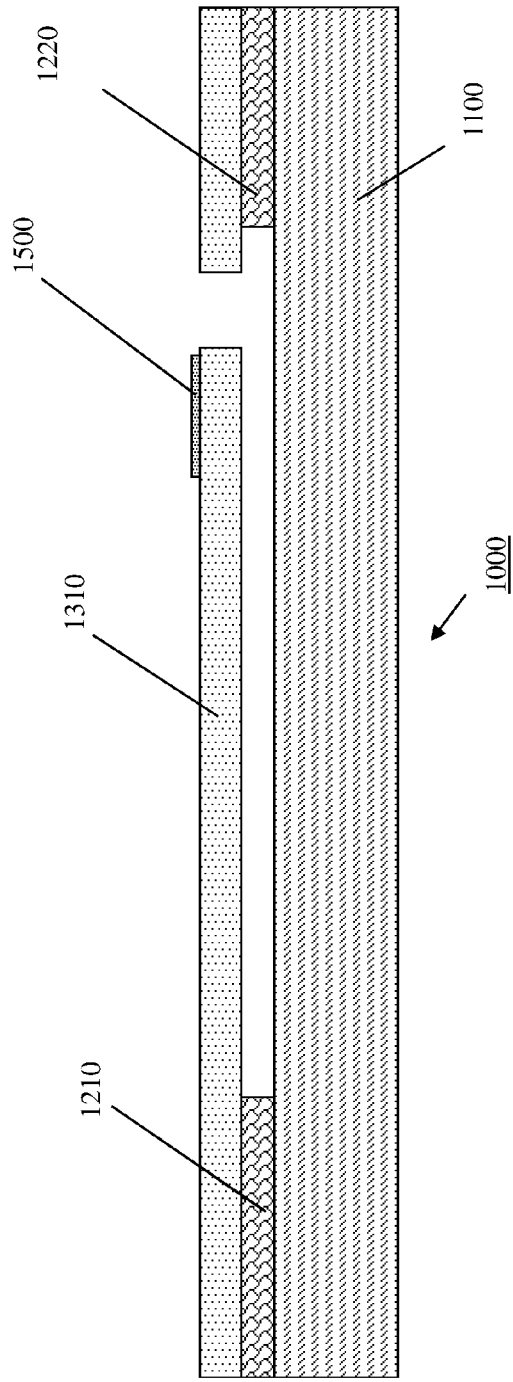
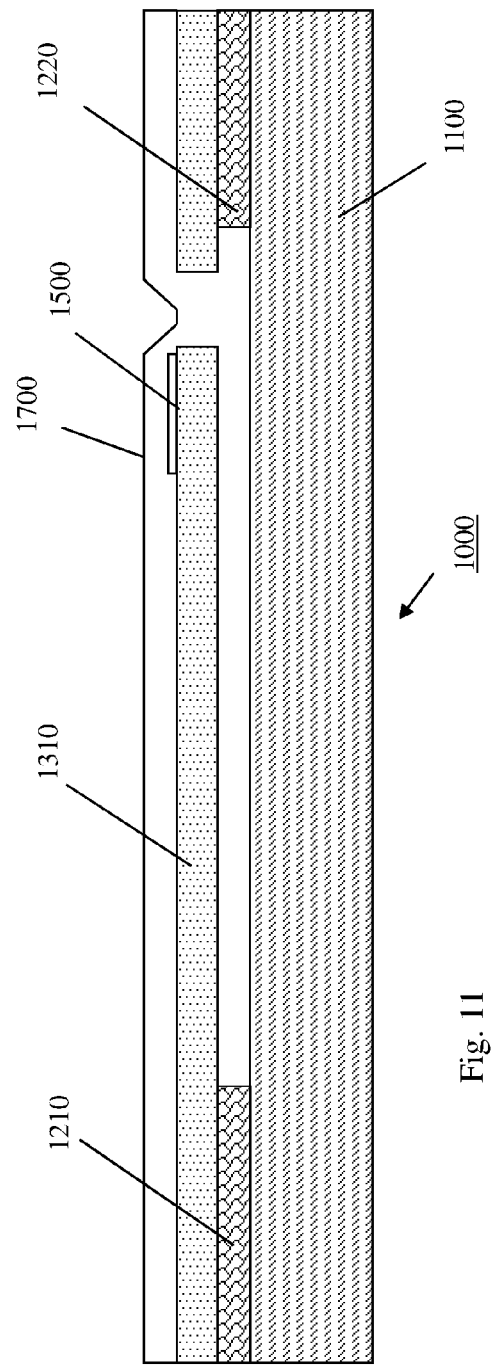
Fig. 10
Fig. 11

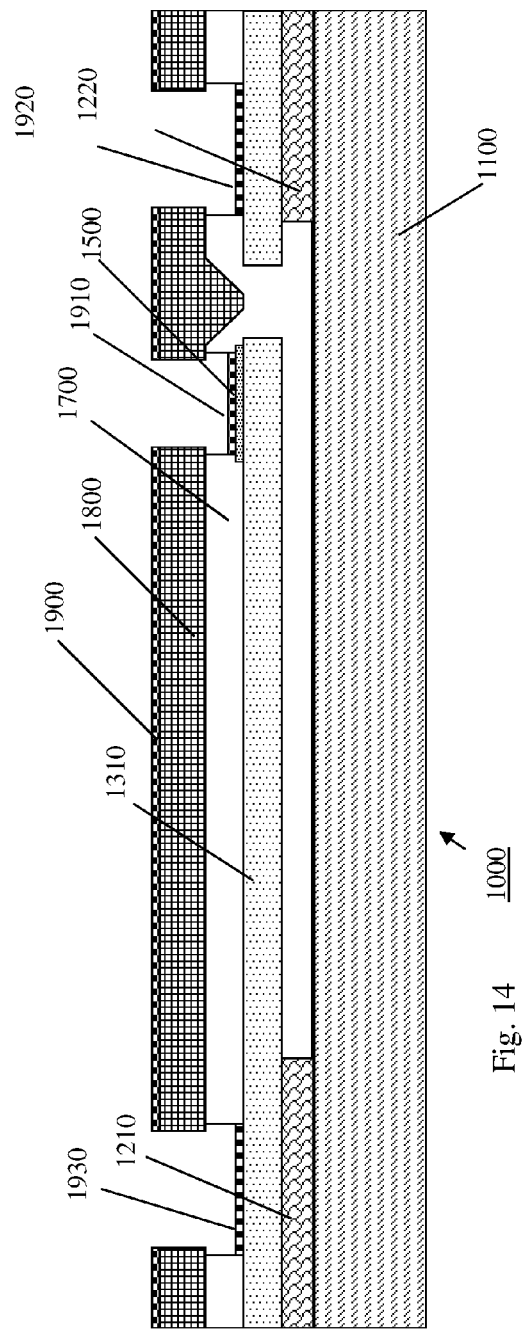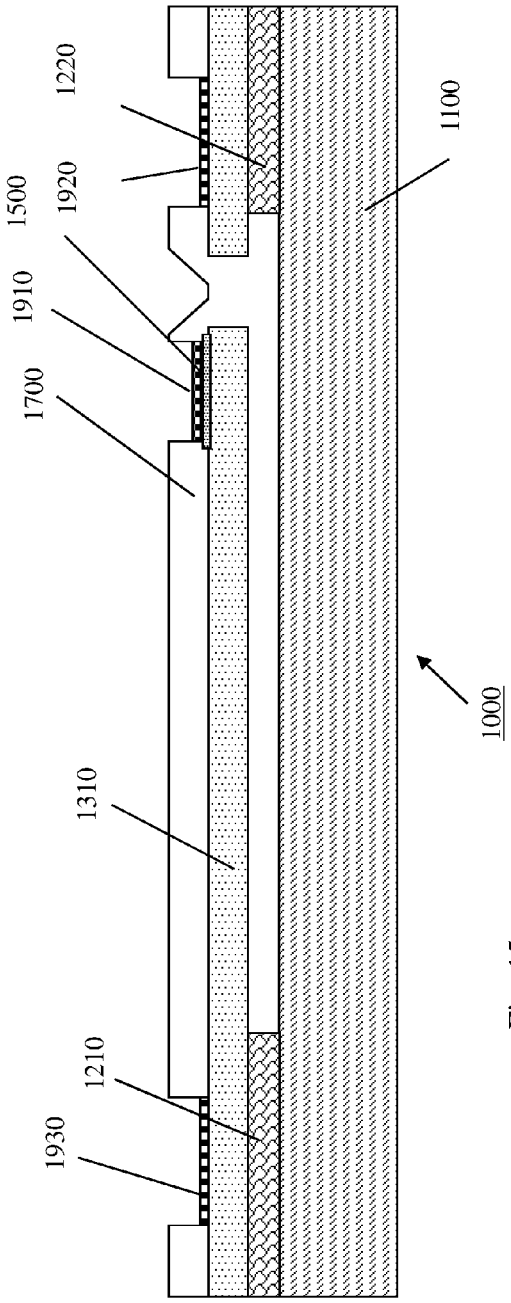

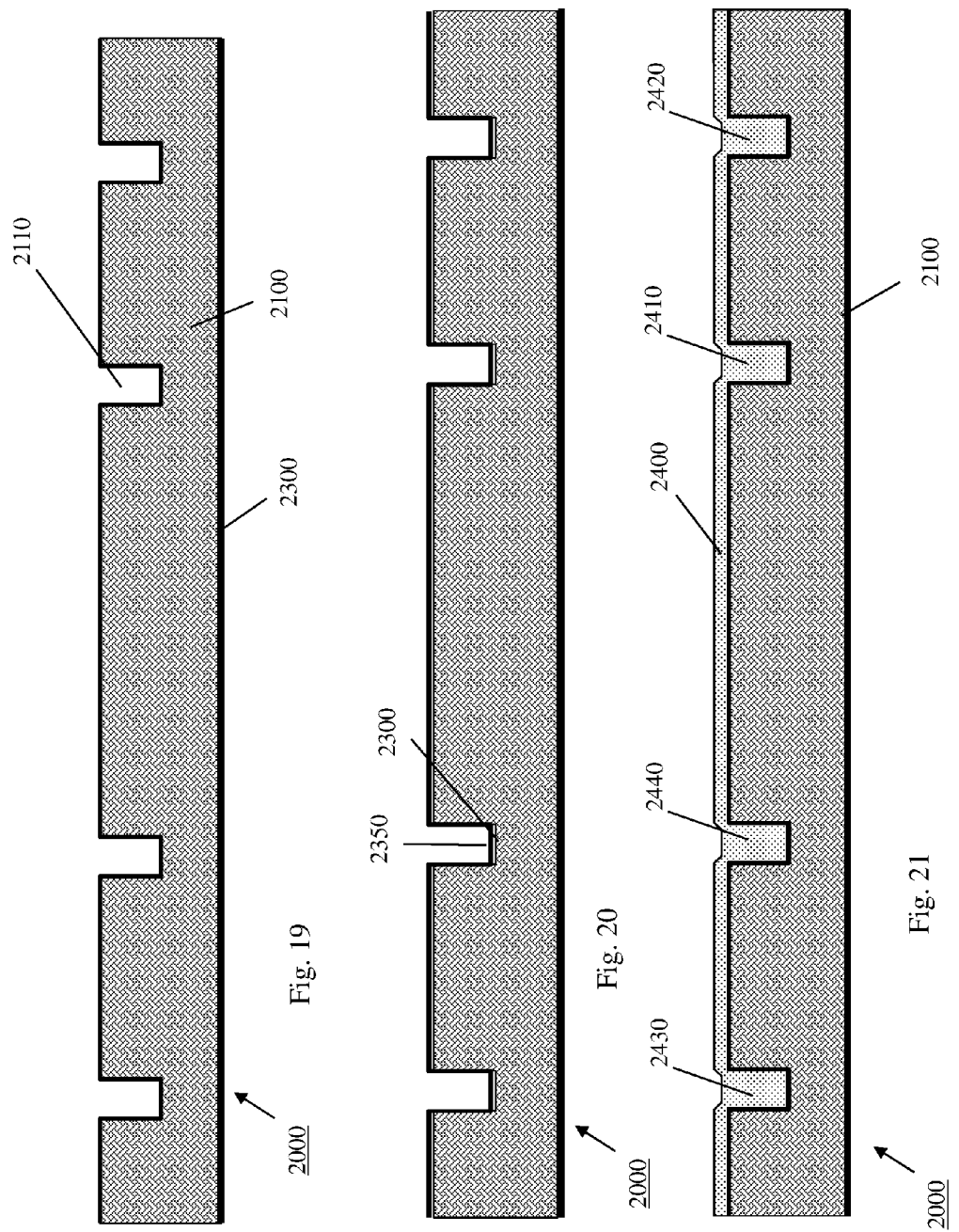

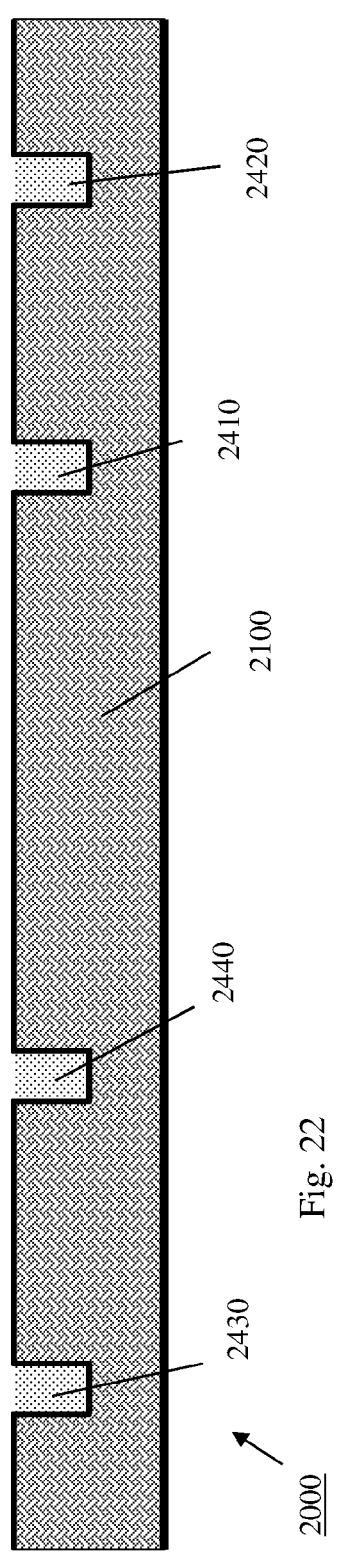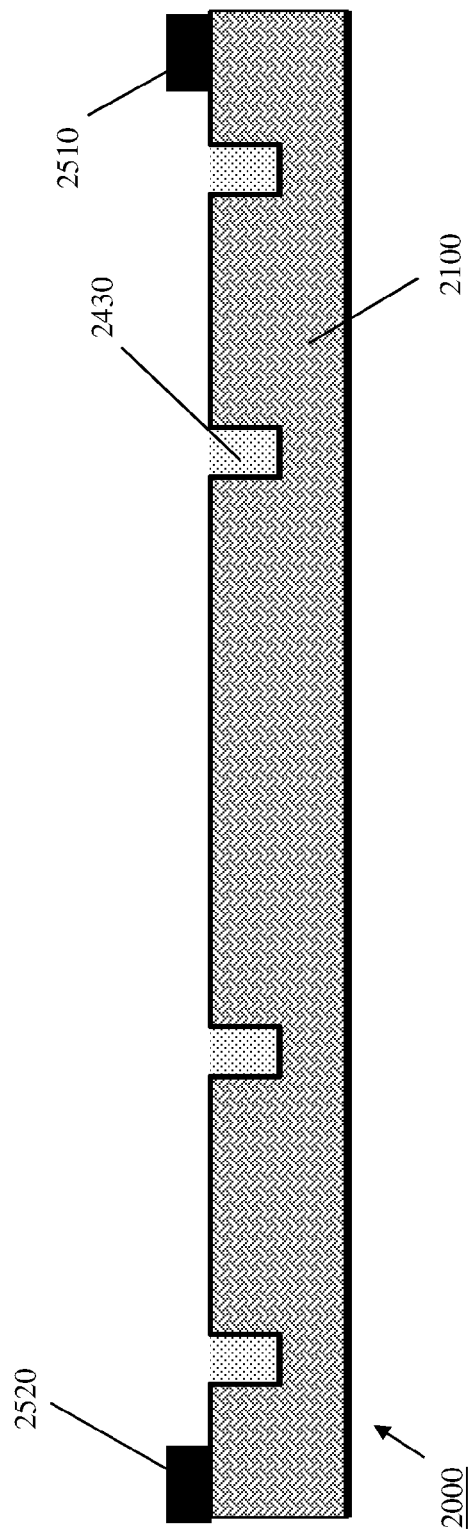

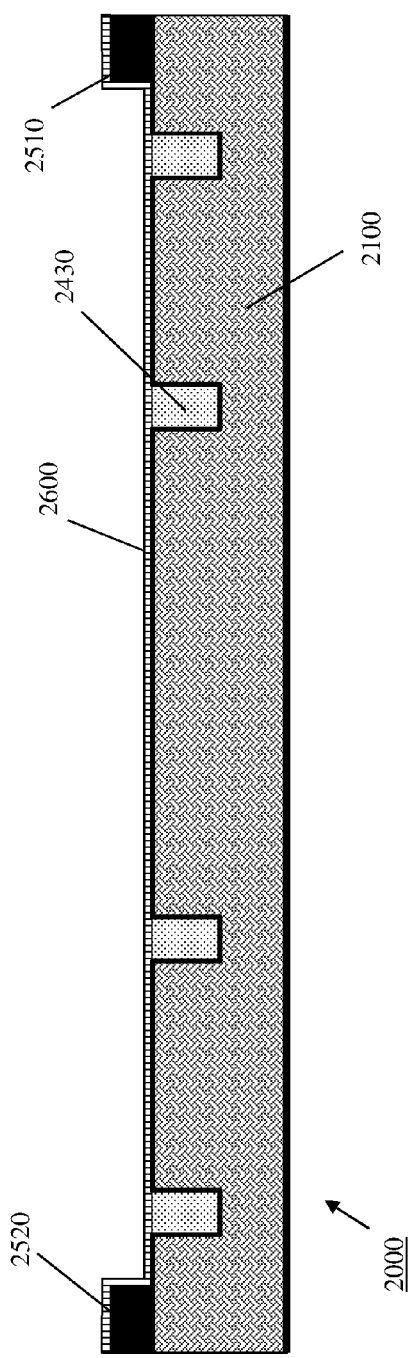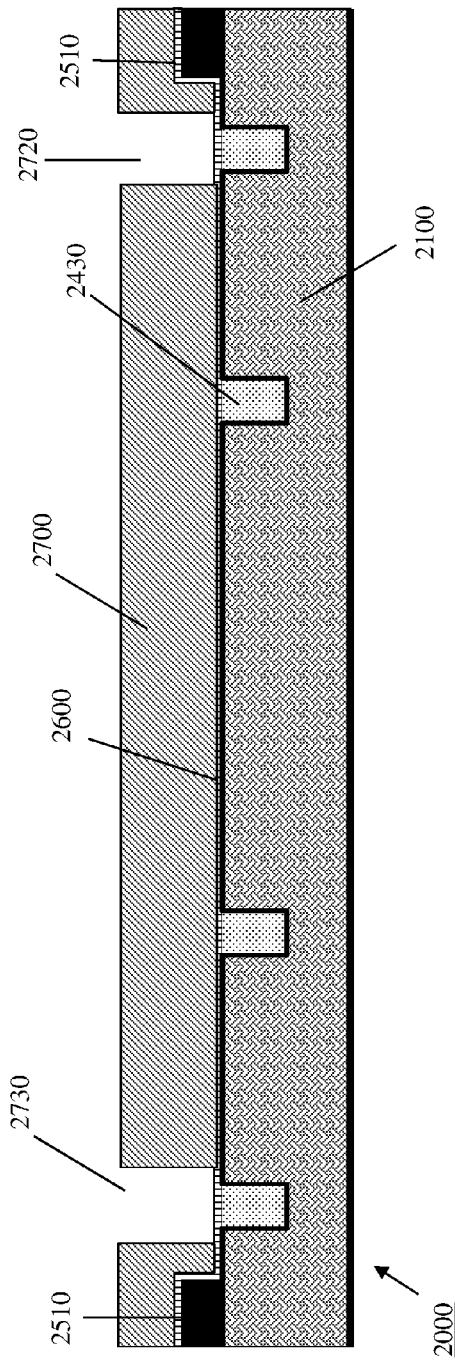
Fig. 24
Fig. 25

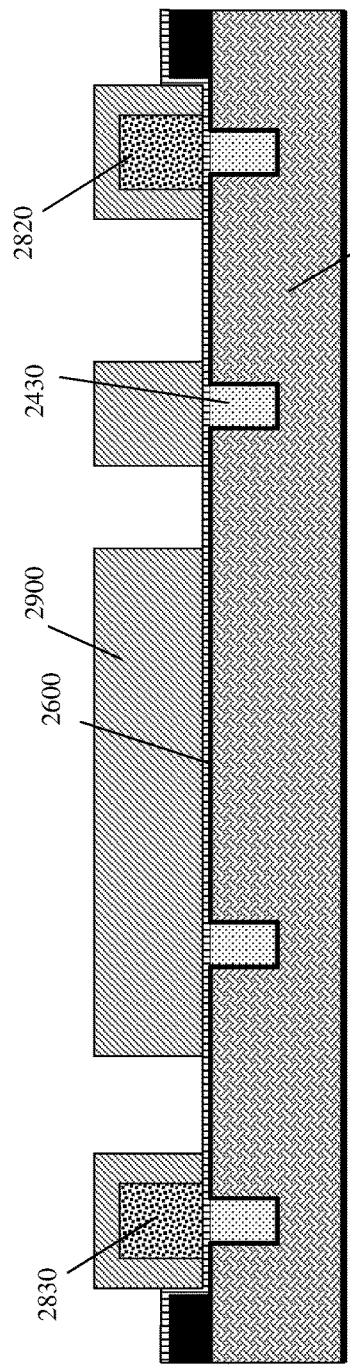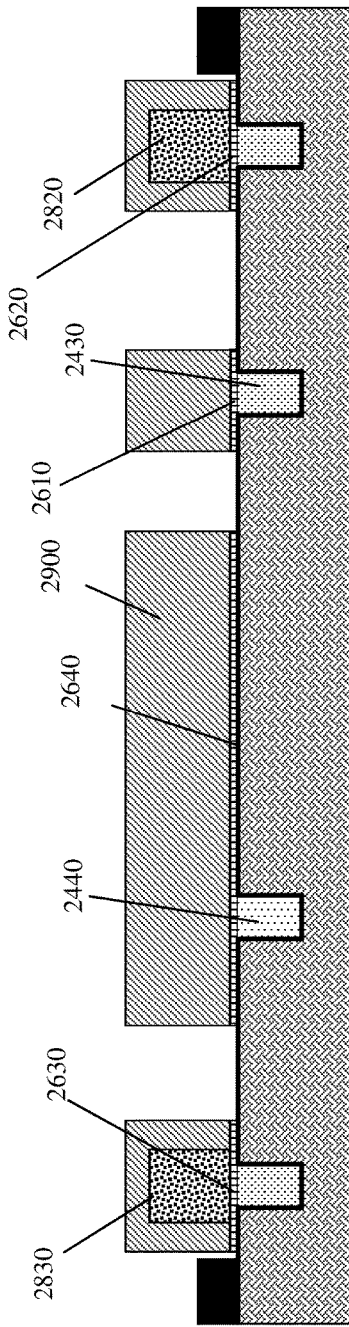

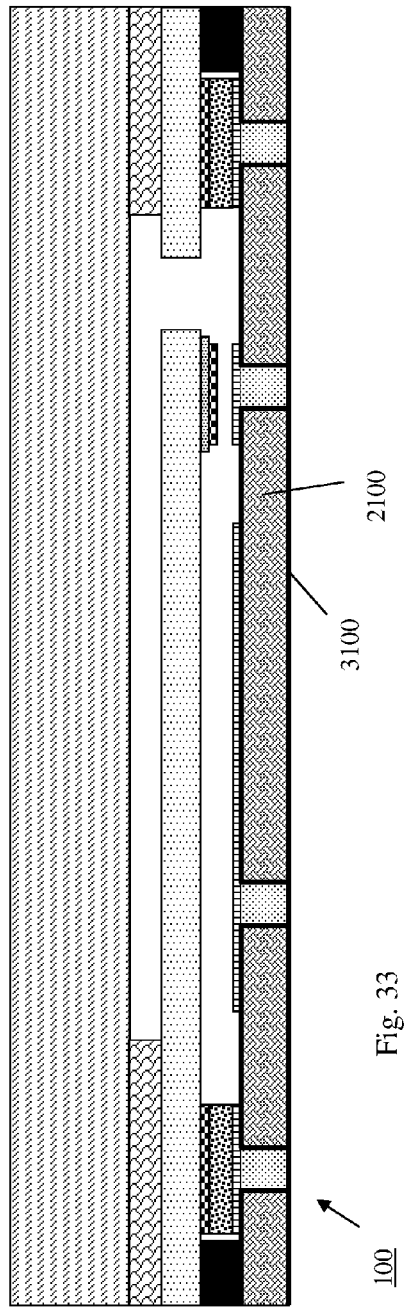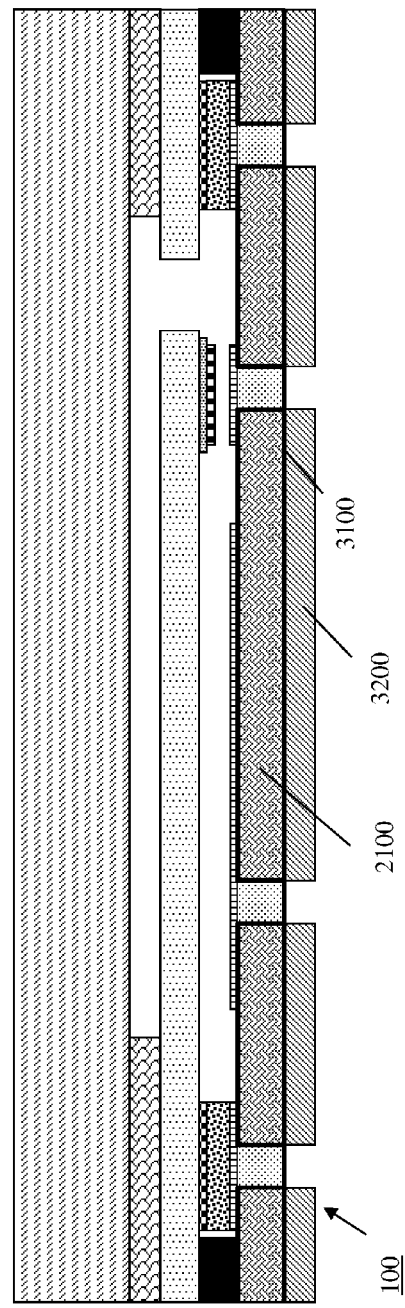

DUAL SUBSTRATE ELECTROSTATIC MEMS SWITCH WITH MULTIPLE HINGES AND METHOD OF MANUFACTURE

CROSS REFERENCE TO RELATED APPLICATIONS

Not applicable.

STATEMENT REGARDING FEDERALLY SPONSORED RESEARCH

Not applicable.

STATEMENT REGARDING MICROFICHE APPENDIX

Not applicable.

BACKGROUND

This invention relates to an electrostatic microelectromechanical switch and its method of manufacture.

Microelectromechanical systems are devices often having moveable components which are manufactured using lithographic fabrication processes developed for producing semiconductor electronic devices. Because the manufacturing processes are lithographic, MEMS devices may be made in very small sizes. MEMS techniques have been used to manufacture a wide variety of sensors and actuators, such as accelerometers and electrostatic cantilevers.

MEMS techniques have also been used to manufacture electrical relays or switches of small size, generally using an electrostatic actuation means to activate the switch. MEMS devices often make use of silicon-on-insulator (SOI) wafers, which are a relatively thick silicon "handle" wafer with a thin silicon dioxide insulating layer, followed by a relatively thin silicon "device" layer. In the MEMS devices, a thin cantilevered beam of silicon is etched into the silicon device layer, and a cavity is created adjacent to the thin beam, typically by etching the thin silicon dioxide layer to allow for the electrostatic deflection of the beam. Electrodes provided above or below the beam may provide the voltage potential which produces the attractive (or repulsive) force to the cantilevered beam, causing it to deflect within the cavity.

One known embodiment of such an electrostatic relay is disclosed in U.S. Pat. No. 6,486,425 to Seki. The electrostatic relay described in this patent includes a fixed substrate having a fixed terminal on its upper surface and a moveable substrate having a moveable terminal on its lower surface. Upon applying a voltage between the moveable electrode and the fixed electrode, the moveable substrate is attracted to the fixed substrate such that an electrode provided on the moveable substrate contacts another electrode provided on the fixed substrate to close the microrelay.

However, to fabricate the microrelay described in U.S. Pat. No. 6,486,425, the upper substrate must be moveable, so that the upper substrate must be thin enough such that the electrostatic force may cause it to deflect. The moveable substrate is formed from a silicon-on-insulator wafer, wherein the cantilevered beam is formed in the silicon device layer, and the SOI wafer is then adhered to the fixed substrate. The silicon handle wafer and silicon dioxide insulating layer are then removed from the SOI wafer, leaving only the thin silicon device layer which forms the moveable substrate.

SUMMARY

Because the top substrate of the microrelay is necessarily moveable, it is also susceptible to damage from contact during or after fabrication.

The systems and methods described here form an electrostatic MEMS switch using dual substrates, one on which to form the cantilevered beam with an electrical shunt beam to provide an electrical connection between two contacts of a switch, and the other on which to form the two contacts of the switch. In the systems and methods described here, the attachment point of the cantilevered beam remains fixed to the silicon dioxide and handle layer of the SOI substrate. A portion of the silicon dioxide layer adjacent to the cantilevered beam is etched to release the beam, however, a silicon dioxide attachment point remains which affixes the cantilevered beam to the silicon handle layer. The silicon dioxide layer therefore provides the cantilevered point of adhesion to the upper substrate, rather than being fixed by a support member to the lower, fixed substrate. Because the remainder of the rigid, SOI wafer remains intact, it may provide protection for the switch against inadvertent contact and shock.

Because the rigid SOI wafer remains intact, it may also be hermetically bonded to the second, lower substrate at the end of the fabrication process. By forming the hermetic seal, the switch may enclose a particular gas environment which may be chosen to increase the breakdown voltage of the gas environment within the switch. The hermetic seal may also protect the electrostatic MEMS switch from ambient dust and debris, which may otherwise interfere with the proper functioning of the device.

In one exemplary embodiment, the method for manufacturing the MEMS switch may include forming a cantilevered beam on a first substrate, forming at least one contact on a second substrate, and coupling the first substrate to the second substrate with a hermetic seal that encloses the MEMS switch. By forming these features on separate substrates, the cleanliness of the contact points may be maintained during processing, before the substrates are sealed hermetically.

The cantilevered beam may be formed by etching the perimeter shape in the device layer of an SOI substrate. Additional advantageous mechanical properties may be achieved by forming a second void in the cantilevered beam. In some embodiments, the second void may have the shape of an H, I, U or C.

The hermetic seal may be made by forming an alloy of gold and indium, $AuIn_2$ by melting a layer of indium deposited over a layer of gold. The hermetic seal is therefore also conductive, and may provide electrical access to the cantilevered beam, for example. The hermetic seal may be particularly important for switching applications involving relatively high voltage signals, wherein an insulating gas may be needed to prevent electrical breakdown of the air between the high voltage electrodes. In such cases, the insulating gas may need to be sealed hermetically to create an environment for the MEMS switch which can withstand higher voltages without breaking down, without allowing the gas to leak out of the MEMS switch seal.

In another exemplary embodiment, electrical access to the switch may be gained using through hole vias formed in the second, lower substrate. By providing electrical access through the lower substrate, the hermetic seal is not compromised by the presence of electrical leads being routed under the bond line.

The systems and methods described herein may be appropriate for the fabrication of an RF electrostatic MEMS switch which is capable of operating in the range of DC to 10 GHz.

These and other features and advantages are described in, or are apparent from, the following detailed description.

BRIEF DESCRIPTION OF THE DRAWINGS

Various exemplary details are described with reference to the following figures, wherein:

FIG. 5 is a cross sectional view of the exemplary substrate of FIG. 4 after etching the cantilever beam of the electrostatic MEMS switch;

FIG. 6 is a cross sectional view of the exemplary substrate of FIG. 5 after releasing the cantilever beam;

FIG. 7 is a cross sectional view of the exemplary substrate of FIG. 6 after deposition of an isolation layer;

FIG. 8 is a cross sectional view of the exemplary substrate of FIG. 7 after deposition and patterning of photoresist;

FIG. 10 is a cross sectional view of the exemplary substrate of FIG. 9 after removal of the photoresist;

FIG. 11 is a cross sectional view of the exemplary substrate of FIG. 10 after deposition of a liftoff layer;

FIG. 14 is a cross sectional view of the exemplary substrate of FIG. 13 after deposition of the shunt bar and contacts;

FIG. 15 is a cross sectional view of the exemplary substrate of FIG. 14 after removal of the photoresist layer and overlying metal;

FIG. 19 is a cross sectional view of the exemplary substrate of FIG. 18 after oxidation of the substrate;

FIG. 20 is a cross sectional view of the exemplary substrate of FIG. 19 after deposition of a seed layer;

FIG. 21 is a cross sectional view of the exemplary substrate of FIG. 20 after plating of the vias;

FIG. 22 is a cross sectional view of the exemplary substrate of FIG. 21 after chemical mechanical planarization;

FIG. 23 is a cross sectional view of the exemplary substrate of FIG. 22 after deposition of the polymer spacers;

FIG. 24 is a cross sectional view of the exemplary substrate of FIG. 23 after deposition of a seed layer;

FIG. 25 is a cross sectional view of the exemplary substrate of FIG. 24 after deposition of photoresist;

FIG. 28 is a cross sectional view of the exemplary substrate of FIG. 27 after deposition of photoresist;

FIG. 29 is a cross sectional view of the exemplary substrate of FIG. 28 after etching the seed layer;

FIG. 33 is a cross sectional view of the dual substrate MEMS switch after sputtering the isolation oxide on the underside of the dual substrate MEMS switch;

FIG. 34 is a cross sectional view of the dual substrate MEMS switch after depositing photoresist over the isolation layer;

FIG. 45a.

It should be understood that the drawings are not necessarily to scale, and that like numbers may refer to like features.

DETAILED DESCRIPTION

In the systems and methods described here, an electrostatic MEMS switch is fabricated on two substrates. A cantilevered beam carrying a shunt bar is formed on the first substrate, and the electrical contacts of the switch, which will be connected via the shunt bar on the cantilevered beam when the switch is closed, are formed on the other substrate. The two substrates are then sealed hermetically by a gold-indium seal. Electrical access to the switch is afforded by a set of through hole vias, which extend through the thickness of the second substrate. Although the systems and methods are described as forming the cantilevered beam first followed by the electrical contacts, it should be understood that this embodiment is exemplary only, and that the electrical contacts may be formed first, or in parallel with, the formation of the cantilevered beam.

Figure 1:
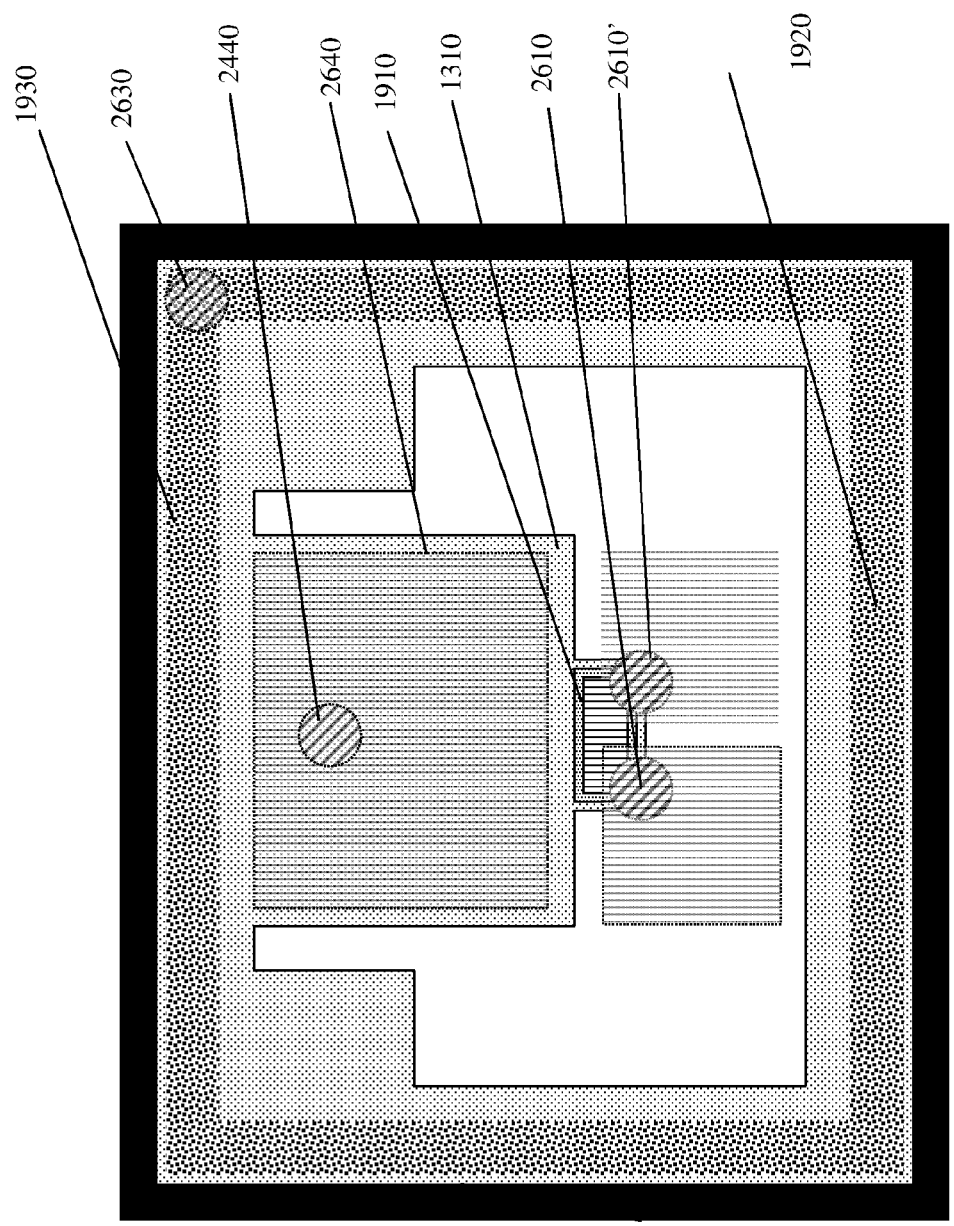
FIG. 1 is a plan view showing the dual substrate electrostatic MEMS switch with hermetic seal.

FIG. 1 is a plan view of the dual substrate electrostatic MEMS switch 100. The switch may include a cantilevered beam 1310 bearing a shunt bar 1910. The shunt bar is designed to span two contact points, 2610 and 2610'. Since the second of the two contact points 2610' lies directly behind the first contact point 2610, only the first contact point 2610 is shown in the following cross sectional diagrams. The cantilevered beam is actuated by an electrostatic plate 2640, which may be disposed directly beneath the cantilevered beam 1310. The cantilevered beam 1310 itself may form the adjacent plate of a parallel plate capacitor. When a differential voltage is placed on the cantilevered beam 1310 relative to the electrostatic plate 2640, the cantilevered beam is drawn toward the electrostatic plate 2640. The action lowers the shunt bar 1910 into a position where it contacts the contact points 2610 and 2610', thereby closing an electrical circuit.

Figure 2:
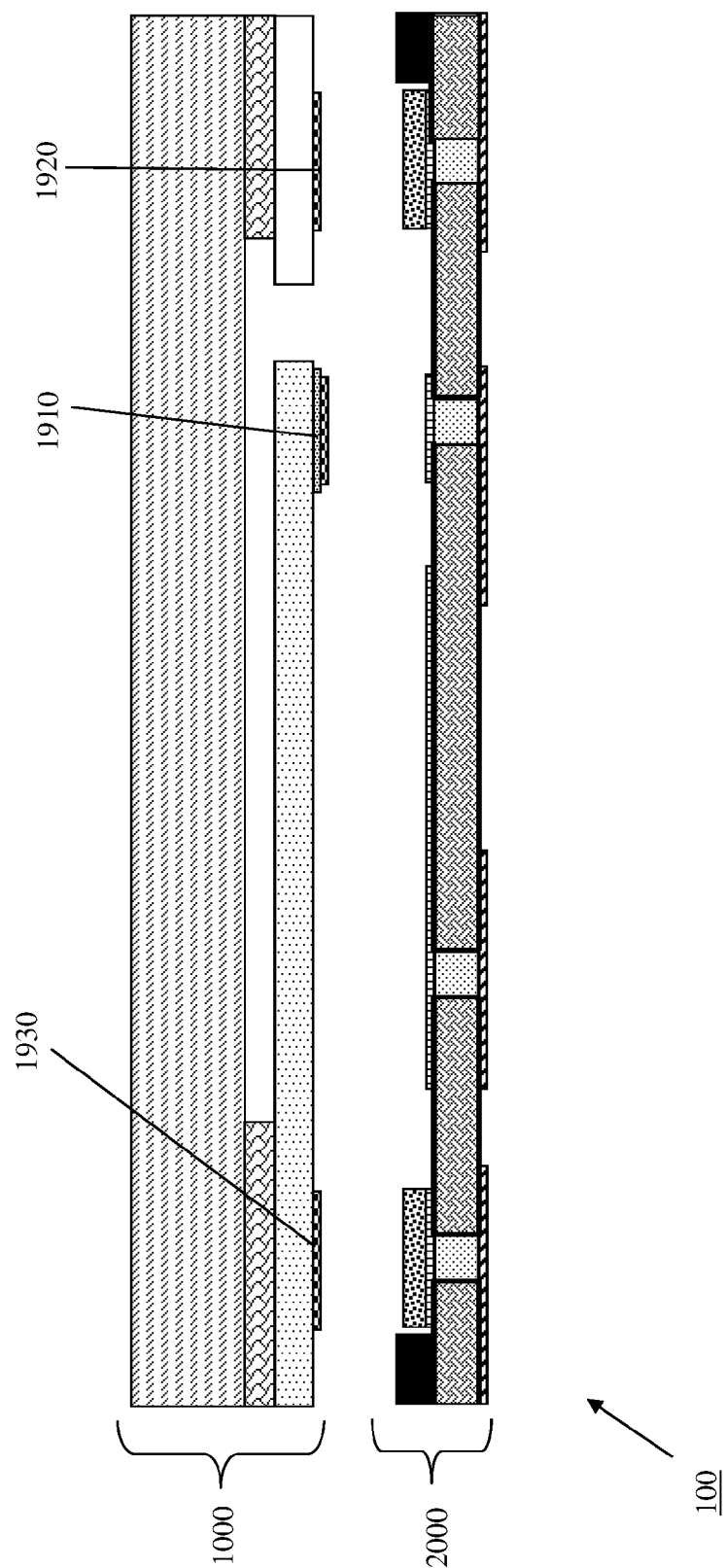
FIG. 2 is a cross sectional view showing the dual substrate electrostatic MEMS switch with hermetic seal.

FIG. 2 shows a cross section of the overall construction of the dual substrate electrostatic MEMS switch 100. The two components of the switch may be the cantilevered beam portion 1000 and the electrical contacts portion 2000. Fabrication of the electrostatic MEMS switch will be described first with respect to the cantilevered beam portion 1000, and thereafter with respect to the electrical contacts portion 2000. FIGS. 2-15 depict the fabrication of the cantilevered beam portion 1000, and FIGS. 16-28 depict the fabrication of the electrical contacts portion 2000. FIGS. 29-38 depict the final processing steps of the dual substrate electrostatic MEMS switch 100.

Figure 3:
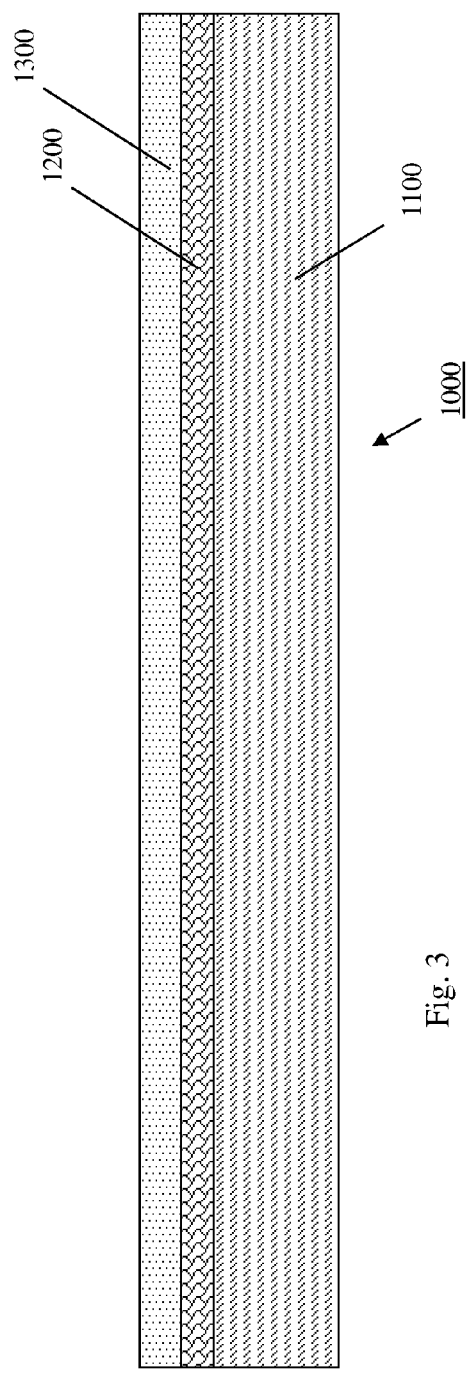
FIG. 3 is a cross sectional view of an exemplary substrate for forming the cantilever beam of the electrostatic MEMS switch.

FIG. 3 shows a cross section of an exemplary substrate 1000 for fabricating the cantilevered beam. The substrate 1000 may be a silicon-on-insulator (SOI) substrate, well known in the art of MEMS processing. The SOI substrate may consist of a relatively thick "handle" wafer 1100, of a thickness of, for example, 600 µm, which may be made of silicon. A thin (about 2 µm) layer 1200 of insulator may cover the silicon handle wafer 1100. The thin insulating layer 1200 may be silicon dioxide, which is grown over or deposited on the silicon handle wafer 1100. On top of the silicon dioxide layer 1200 is another, thinner "device" layer 1300. The device layer 1300, like the handle wafer 1100, may be made of silicon. The silicon device layer 1300 may be, in this embodiment, about 5 µm thick. The device wafer 1300 may be fusion bonded, or otherwise adhered to the silicon dioxide layer 1200 and handle wafer 1100. In MEMS processing, the moveable features of the MEMS device are typically etched in the device layer 1300, using the silicon dioxide layer 1200 as a convenient etch stop.

Figure 4:
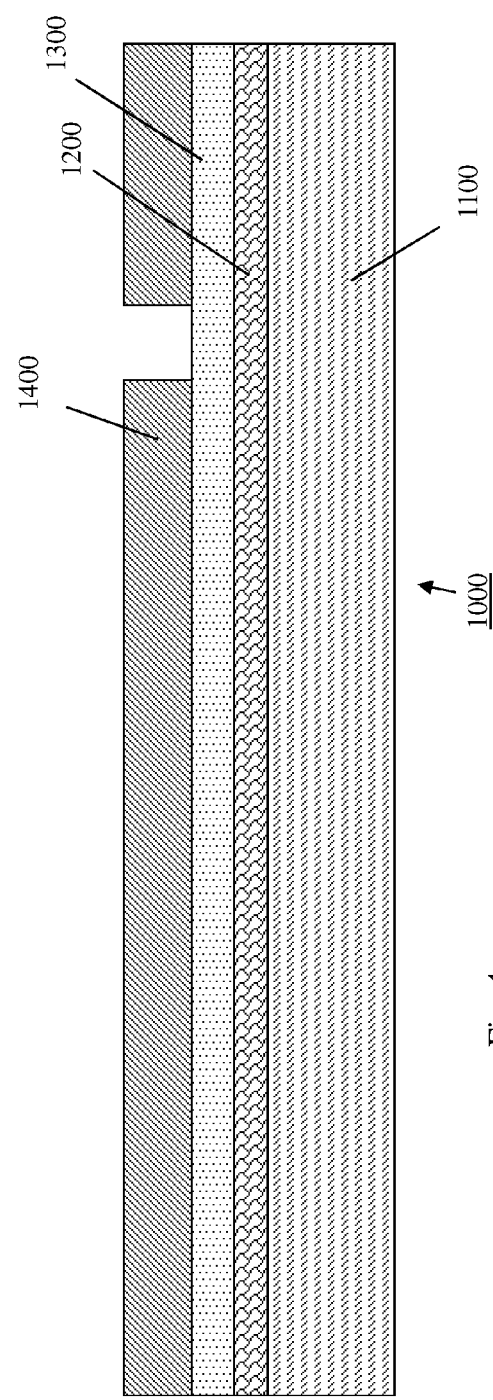
FIG. 4 is a cross sectional view of the exemplary substrate of FIG. 3 after deposition and patterning of photoresist.

FIG. 4 depicts a first step in fabricating the cantilevered beam portion 1000. In FIG. 4, photoresist is deposited over the device layer 1300, and exposed according to a pattern formed in a photolithographic mask. The exposed portions of the photoresist are dissolved and removed if a positive photoresist is used. If a negative photoresist is used, the unexposed regions are dissolved and removed. In the following description, it should be understood that either a positive or negative photoresist may be used. The areas in which the photoresist has been removed correspond to the outline of the cantilevered beam that will be formed in the device layer 1300.

The device is then etched as illustrated in FIG. 5. The etching techniques may be deep reactive ion etching (DRIE), which forms very steep, nearly vertical sidewalls through the device layer 1300. The deep reactive ion etching technique may also use an inductively coupled plasma source, such as the DRIE system manufactured by Surface Technology Systems of Newport, United Kingdom. The DRIE process forms the outline of the cantilevered beam 1310 in the device layer 1300. Because the cantilevered beam 1310 is formed from the silicon device layer 1300, the thickness of the beam may be the thickness of the silicon device layer, about 5 µm. The length of the cantilevered beam 1310 may be about 200 to 300 µm from the edge of the substrate to the end of the cantilevered beam 1310.

The etching process may leave the cantilevered beam 1310 separated from the remaining portion of the device layer 1320. However, at this point the cantilevered beam is still attached to the handle wafer 1100 by the thin layer of silicon dioxide 1200.

The cantilevered beam 1310 may be released from the handle wafer 1100 by performing, for example, an etch to remove a portion of the underlying silicon dioxide layer 1200. The resulting structure after etching the silicon dioxide layer 1200 is shown in cross section in FIG. 6. One exemplary method for removing the silicon dioxide layer is to wet etch the silicon dioxide in a solution of hydrofluoric (HF) acid. The solution composition may be about 49% HF and water. The etch process may be used to dissolve the silicon dioxide relatively far back from the end of the cantilevered beam 1310 by providing additional through holes in the cantilevered beam 1310 to provide additional conduits for the etchant. For simplicity of depiction, these additional holes are not shown in FIG. 6.

The next step in the fabrication of the cantilevered portion 1000 is deposition of an oxide isolation layer 1500 on the cantilever. The isolation layer will electrically isolate the shunt bar 1910 from the cantilevered beam of silicon material 1310. FIG. 7 shows a cross section of the cantilevered beam portion 1000 after deposition of the isolation layer 1500. As shown in FIG. 7, the isolation layer 1500 may be deposited over the entire surface, including the gap between the silicon cantilevered beam 1310 and the remaining portions of silicon 1320. In various exemplary embodiments, the isolation layer may be silicon dioxide, and may be, for example, about 2000 Angstroms thick. The oxide may be deposited in an oxidation furnace or by sputtering, for example.

Figure 9:
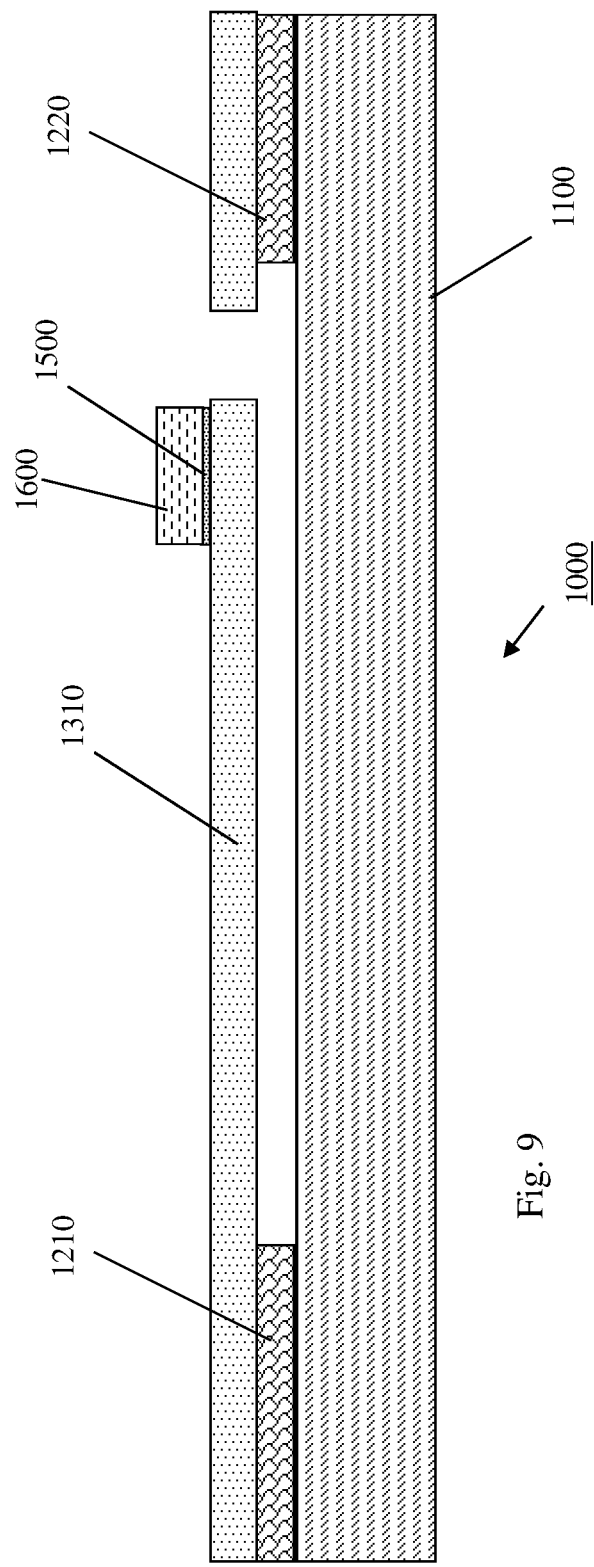
FIG. 9 is a cross sectional view of the exemplary substrate of FIG. 8 after etching the isolation layer.

The next step in the fabrication of the cantilevered portion 1000 is the removal of the silicon dioxide isolation layer 1500 everywhere but in the location of the shunt bar 1910. As depicted in the cross section of FIG. 8, the thin isolation layer 1500 is first covered with photoresist 1600 which is patterned and developed so that the photoresist 1600 covers only the region that will contain the shunt bar 1910. The oxide isolation layer 1500 is then removed everywhere not covered by photoresist 1600, as shown in FIG. 9. The oxide may be removed by, for example, reactive ion etching (RIE). This process also removes the silicon dioxide isolation layer 1500 which was deposited between the silicon cantilevered beam 1310 and the remaining silicon 1320.

The photoresist 1600 used to form the isolation layer 1500 is then stripped, leaving the cantilevered beam portion 1000 in the condition shown in FIG. 10. The process then proceeds with the steps needed to form the shunt bar 1910. The shunt bar 1910 may be formed by a liftoff procedure described next.

The first step in the lift off procedure is the deposition of an anchoring layer of polyimide 1700, as shown in FIG. 11. The purpose of the anchoring layer of polyimide 1700 is to anchor the previously released cantilevered beam 1310, and protect it during a lift off procedure which may include an ultrasonic treatment. The ultrasonic treatment may be used later to selectively dissolve photoresist and lift off a metal layer which will be deposited to form the shunt bar 1910.

Figure 12:
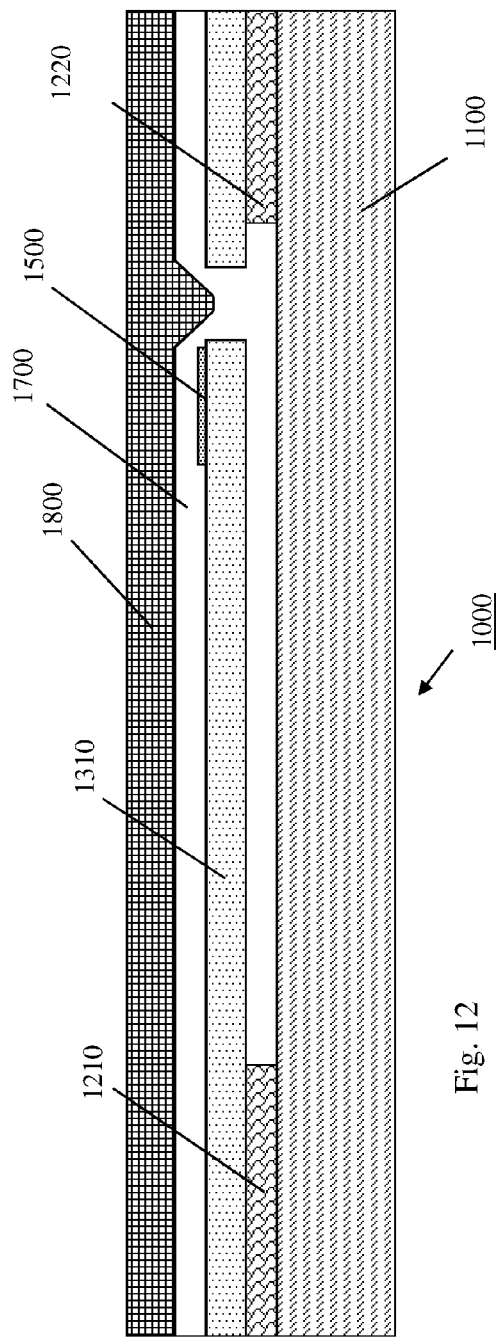
FIG. 12 is a cross sectional view of the exemplary substrate of FIG. 11 after deposition of a photoresist layer.
Figure 13:
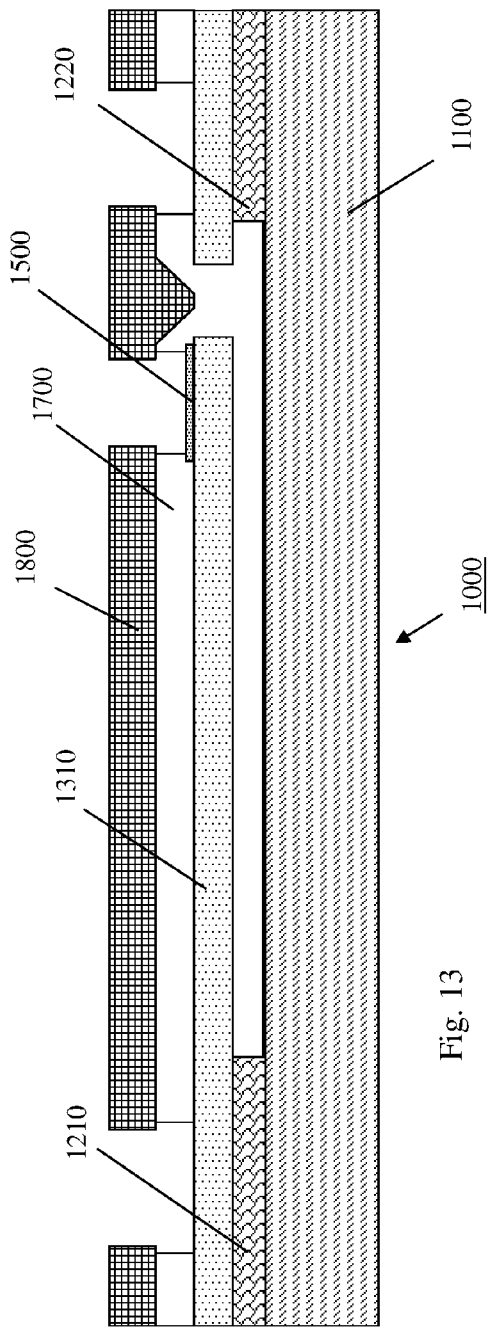
FIG. 13 is a cross sectional view of the exemplary substrate of FIG. 12 after patterning of the liftoff and photoresist layers.

Photoresist 1800 may then be deposited over the polyimide 1700, as shown in FIG. 12. The photoresist 1800 and polyimide 1700 are then patterned as shown in FIG. 13. This pattening will create the features of the shunt bar 1910, and also the metallization layers 1920 and 1930 which will participate in the bonding of the cantilevered beam portion 1000 with the electrical contacts portion 2000 of the dual substrate electrostatic MEMS switch 100. One helpful feature of the developer soluble polyimide 1700 is that it undercuts slightly the photoresist 1800, creating a slight overhang of the photoresist 1800 over the polyimide 1700. This may help assure a clean lift off of the metal layer which will be deposited over the patterned surface.

FIG. 14 shows the deposition of the metallization layer 1900. The metallization layer 1900 may actually be a multilayer comprising first a thin layer of chromium (Cr) for adhesion to the silicon and silicon dioxide surfaces. The Cr layer may be from about 50 Angstroms to about 100 Angstroms in thickness. The Cr layer may be followed by a 100 Angstrom thick layer of molybdenum (Mo), and finally a thicker layer about 3000 Angstroms to about 5000 Angstroms of gold (Au) as the conductive metallization layer. The purpose of the Mo layer is to be a diffusion barrier between the Cr and the Au, preventing the diffusion of Cr into the Au, which would otherwise dramatically increase the resistance of the Au.

Each of the Cr, Mo and Au layers may be sputter-deposited using, for example, an ion beam deposition chamber (IBD). In an IBD chamber, the three targets, Cr, Mo and Au may be rotated into position to deposit the multilayer films without breaking the vacuum. The metallization multilayer 1900 may be deposited in the region corresponding to the shunt bar 1910, and also the regions which will correspond to the bond line between the cantilevered portion 1000 and the electrical contacts portion 2000 of the dual substrate electrostatic MEMS switch 100. These bond line areas 1920 and 1930 of metallization will form, with a layer of indium, a seal which will hermetically seal the cantilevered portion 1000 with the electrical contacts portion 2000, as will be described further below.

While a Cr/Mo/Au multilayer is disclosed as being usable for the metallization layer 1900 of the shunt bar 1910, it should be understood that this multilayer is exemplary only, and that any other choice of conductive materials or multilayers having suitable electronic transport properties may be used in place of the Cr/Mo/Au multilayer disclosed here. For example, for simple low temperature applications, the molybdenum layer may be omitted. Other materials, such as titanium (Ti) may be used as an adhesion layer between the Si and the Au. Other exotic materials, such as ruthenium (Ru) can be deposited on top of the Au to improve the switch contact properties, etc. However, the choice described above may be advantageous in that it can also participate in the sealing of the device through the alloy bond, as will be described more fully below.

FIG. 15 shows the cantilevered portion 1000 of the dual substrate electrostatic MEMS switch 100 after the photoresist layer 1800 has been lifted off. The liftoff may be achieved by immersing the substrate in acetone in an ultrasonic bath, as mentioned previously. The polyimide layer 1700 does not dissolve in acetone, and therefore remains after the ultrasonic lift off. The lift off also removes all portions of the metallization layer 1900 which are deposited over the photoresist 1800, except for the shunt bar 1910, and the bond line portions 1920 and 1930, which are instead deposited directly on the silicon dioxide isolation layer 1500 and the silicon device layer 1300, respectively.

Figure 16:
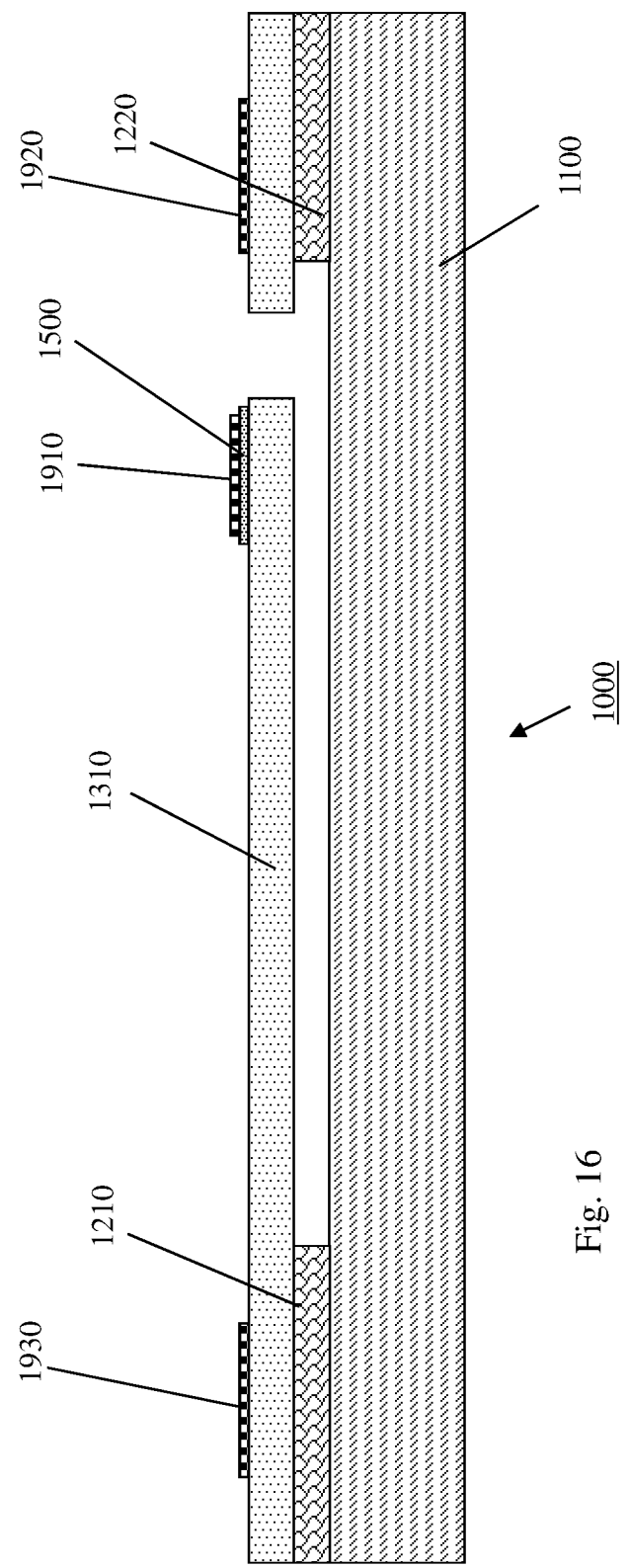
FIG. 16 is a cross sectional view of the finished cantilever beam on the first substrate.

The lift off of photoresist layer 1800 leaves only the layer of polyimide 1700, as shown in FIG. 15. The polyimide layer 1700 may then be removed by applying an aggressive polymer stripper, such as N-methylperrolidone. This removes the layer of polyimide 1700 and completes the fabrication of the cantilevered portion 1000 of the dual substrate electrostatic MEMS switch 100. The finished cantilevered portion 1000 is shown in FIG. 16. The cantilevered portion may now include the cantilevered silicon beam 1310, the shunt bar 1910, the isolation layer 1500, the bond area metallizations 1920 and 1930, and the silicon dioxide region 1220 which adhere the cantilevered beam 1310 to the handle wafer 1100.

The description now turns to the fabrication of the electrical contacts portion 2000.

Figure 17:
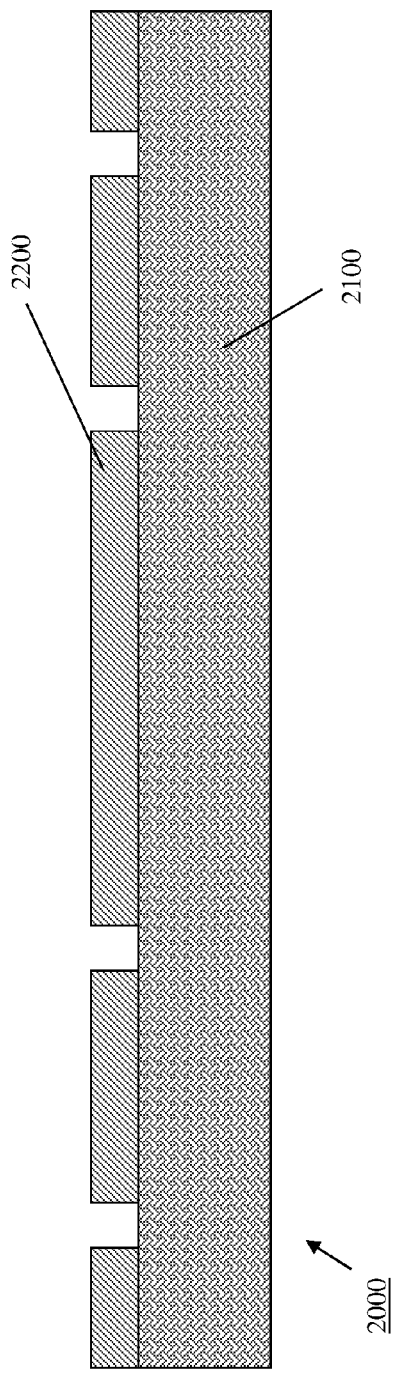
FIG. 17 is a cross sectional view of a second exemplary substrate covered with a patterned photoresist.

FIG. 17 shows a substrate 2100 suitable for fabricating the electrical contacts portion 2000 of the dual substrate electrostatic MEMS switch 100. The substrate 2100 may be, for example, silicon, glass, or any other suitable material consistent with the process described below, or suitable equivalent steps. The substrate 2100 is covered with a photoresist 2200, which is patterned in areas corresponding to the locations of vias, or electrical conduits that will be formed in the substrate 2100.

Figure 18:
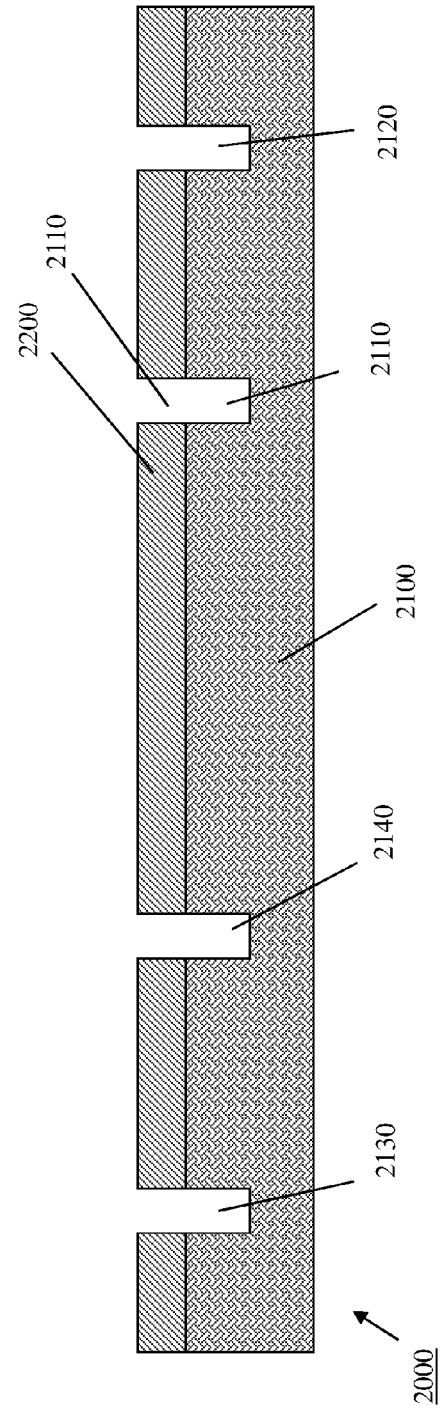
FIG. 18 illustrates the exemplary substrate of FIG. 17 after etching of vias.

Blind trenches may then be etched in the substrate 2100, as shown in FIG. 18, for the formation of a set of vias 2410-2440 which will be formed in the trenches 2110-2140 by plating copper into the trenches. The etching process may be reactive ion etching (RIE) or deep reactive ion etching (DRIE), for example, which may form blind trenches, each with a dead-end wall. Via 2130 may provide electrical access to the cantilevered beam 1310, and provide a voltage for one side of the parallel plate capacitor which may provide the electrostatic force required to close the switch; via 2140 may provide electrical access to an electrostatic plate which forms the other side of the parallel plate capacitor; via 2110 may provide electrical access to one of the contact points (another via provides electrical access to the second electrical contact point, located directly behind the first, and therefore, not shown in FIG. 18); via 2120 may be a redundant electrical connection to the device layer of the SOI wafer, which provides an additional ground path. Many of these grounds vias may be incorporated along the bond line, but only one is shown here.

The substrate 2100 may then be allowed to oxidize thermally, to form a layer of silicon dioxide 2300, which electrically isolates one via from the next, as shown in FIG. 19. In addition, a seed layer 2350 may be deposited on the upper surface of substrate 2100, as shown in FIG. 20. The seed layer 2350 may be, for example, a thin layer of chromium followed by a thin layer of gold, the chromium for adhesion and the gold as a seed layer for the copper which will be plated into the vias 2110-2140. The chromium/gold seed layer 2350 may be, for example, about 5000 Angstroms in thickness, and may be deposited by, for example, ion beam deposition (IBD), at one or multiple angles sufficient to provide an electrically continuous film of plating base to the bottom of the vias. Metals, such as Cu, may also be deposited using chemical vapor deposition (CVD) methods, so long as the metal is a compatible seed layer for the metal to be subsequently plated.

In order to promote "bottom-up" plating, the seed layer 2350 may be covered with an inhibition layer (not shown), to provide a "partially exposed" seed layer, as described in more detail in co-pending U.S. patent application Ser. No. 11/211,624 (now U.S. Pat. No. 7,233,048), incorporated by reference herein in its entirety. The inhibition layer may cover all but the dead-end wall of the seed layer 2350 in the blind hole, such that plating begins at the bottom of the blind hole first and then continues upward to the top. The inhibition layer may be formed by sputter-depositing a layer of material from a target onto a tilted substrate, such that the angle of tilt causes the rim of the via to effectively shadow the dead-end wall, and the sputtered material is not deposited there.

The blind trenches 2110-2140 may then be plated with copper, for example, or any other suitable conductive material that can be plated into the blind trenches, such as gold (Au) or nickel (Ni), to create vias 2410-2440. To assure a complete fill, the plating process may be performed until the plated material fills the blind trenches to a point up and over the surface of the substrate 2100, as shown in FIG. 21. The upper surface of the substrate 2100 may then be planarized, using, for example, chemical mechanical planarization, until the plated vias 2410-2440 are flush with the surface of the substrate 2100, as shown in FIG. 22. The planarization process may stop on the inhibition layer of the substrate, leaving for example, about 1 µm of the previously deposited inhibition layer, further providing electrical isolation between the interior metal structures of the devices, which would otherwise be electrically connected by the silicon substrate.

A pair of standoffs 2510 and 2520 may then be formed on the substrate 2100, as shown in FIG. 23. These standoffs may determine the separation between the substrate bearing the cantilevered beam portion 1000 and the substrate bearing the electrical contacts portion 2000, when the two substrates are bonded together. Any rigid material may be used, which is capable of forming a stiff standoff. In one convenient embodiment, a polymer such as photoresist is patterned and cured for use as standoffs 2510 and 2520. In another embodiment, a LOCOS process may be used to make a knife-edge, inorganic standoff.

Another metallization layer 2600 is then deposited over the substrate 2100, as shown in FIG. 24. In one exemplary embodiment, the metallization layer 2600 may actually be a multilayer of Cr/Mo/Au, the same multilayer as was used for the metallization layer 1900 on the substrate 1100 of the cantilevered beam portion 1000 of the dual substrate electrostatic MEMS switch 100. The metallization multilayer 2600 may have similar thicknesses and may be deposited using a similar process as that used to deposit metallization layer 1900 on substrate 1100. The metallization layer 2600 may also serve as a seed layer for the deposition of indium, as described below.

Although metallization layer 2600 is described as consisting of a thin adhesion layer of Cr, and an antidiffusion layer of Mo, followed by a relatively thick layer of Au, it should be understood that this embodiment is exemplary only, and that any material having acceptable electrical transport characteristics may be used as metallization layer 2600. In particular, additional exotic materials may be deposited over the gold, to achieve particular contact properties, such as low contact resistance and improved wear.

As illustrated in FIG. 25, photoresist 2700 may then be deposited on metalllization layer 2600, and patterned to provide features 2720 and 2730 for the plating of an indium layer. The indium layer will, along with the Au layer, form a hermetic seal that will bond the cantilevered portion 1000 to the electrical contacts portion 2000 of dual substrate electrostatic MEMS switch 100. The photoresist is exposed and developed to produce regions 2710 and 2720.

Figure 26:
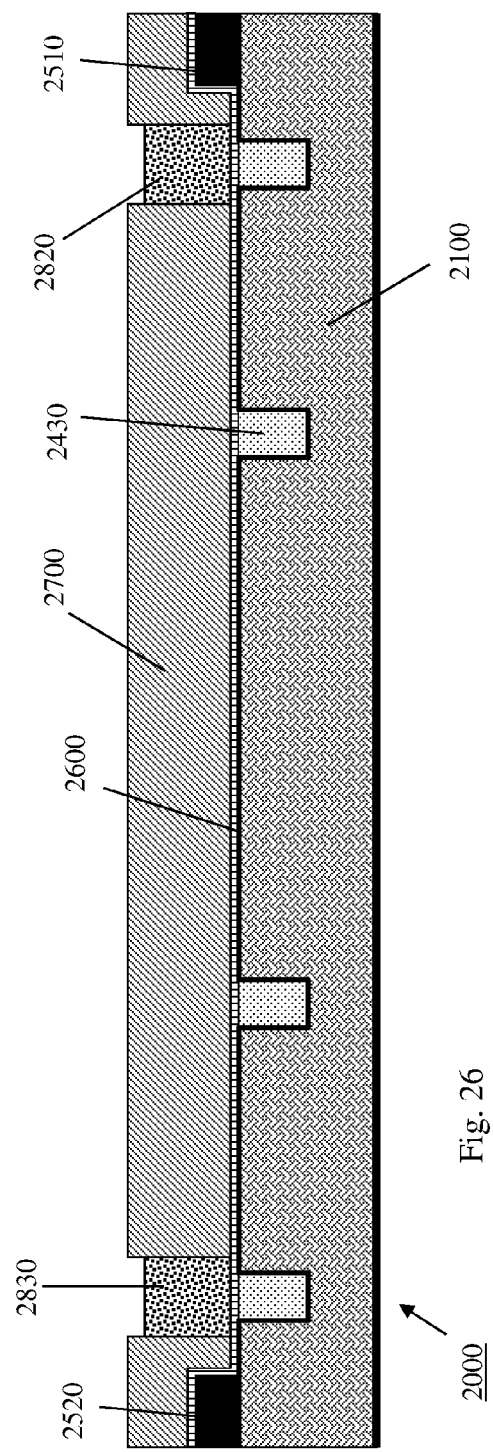
FIG. 26 is a cross sectional view of the exemplary substrate of FIG. 25 after plating of the indium for the alloy bond.

The substrate 2100 with photoresist layer 2700 may then be immersed in an indium plating bath, such that indium layers 2820 and 2830 are plated in features 2720 and 2730, respectively, as shown in FIG. 26. The thickness of the plated indium layer may be, for example, about 3 µm to about 6 µm. It may be important to control the relative thickness (and therefore volume) of the indium compared to the thickness of the Au in metallization layer 2600, such that the ratio of materials may be appropriate to form a eutectic alloy of stoichiometry $AuIn_2$. Since the molar volume of indium is about 50% greater than gold, a combined gold thickness of both wafers of about 8000 Angstroms to about 10000 Angstroms may be approximately correct to form the $AuIn_2$ alloy. It may also be important to provide sufficient gold thickness that a thin layer of gold remains on the surface of the substrate 2100 to provide good adhesion to the substrate, after the formation of the gold/indium alloy. This can additionally be ensured by plating the indium layer narrower than the gold metallization layers, such that the final volumes and ratio of gold/indium provides for a slight excess of gold at the substrate interface.

Figure 27:
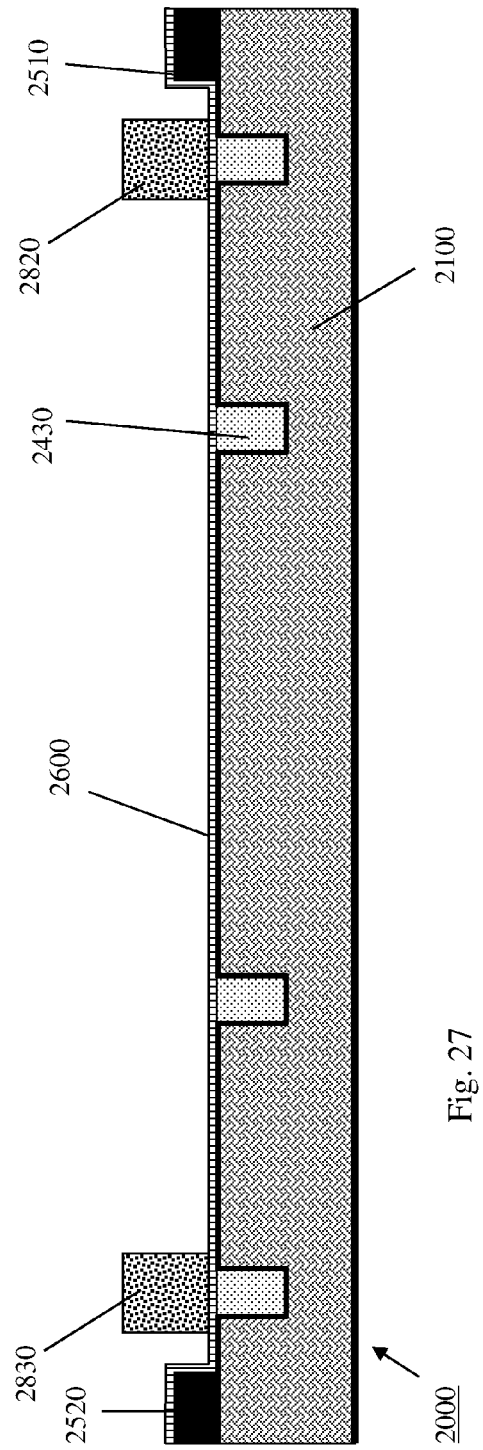
FIG. 27 is a cross sectional view of the exemplary substrate of FIG. 26 after removal of the photoresist.

After plating, the photoresist layer 2700 may be stripped from the substrate, as shown in FIG. 27. Another layer of photoresist 2900 may then be deposited over the surface and patterned as shown in FIG. 28. This photoresist pattern is used to form the isolated metallization contact pads 2610-2610 from the continuous metallization layer 2600. Accordingly, metallization layer 2600 is milled away everywhere it is not protected by photoresist 2700, by, for example, ion milling, as shown in FIG. 29. The photoresist layer 2900 is then stripped from the surface of the substrate 2100, as shown in FIG. 30, leaving pads 2610-2640.

Figure 30:
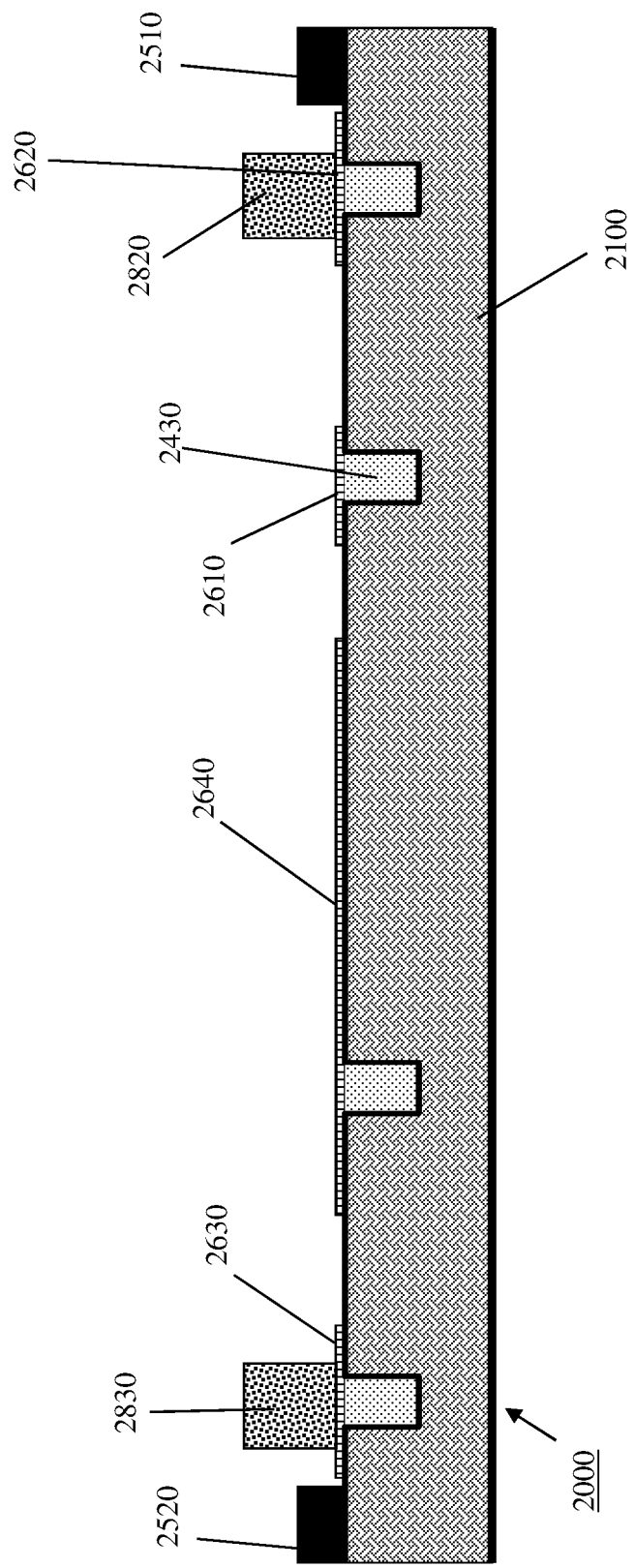
FIG. 30 is a cross sectional view of the exemplary substrate of FIG. 29 after removal of the photoresist.

The ion milling step leaves pad 2610 in the area shown in FIG. 30 for the contacts of the MEMS switch. As discussed previously, there may be a second contact pad 2610' directly behind contact pad 2610, which may serve as the output contact of the switch 100. Pad 2620 is formed in the area under the right-side plated indium layer 2820 as a redundant electrical ground. Pad 2630 is formed in the area under the left-side plated indium layer 2830, and may provide electrical access to one plate of the parallel plate capacitor (the cantilevered beam) through the gold/indium bond to be formed when bonding the cantilevered beam portion 1000 to the electrical contacts portion 2000. Pad 2640 is formed in the area which will be directly beneath the cantilevered beam 1310, and this pad will form the other plate of the parallel plate capacitor which will exert the electrostatic force on the cantilevered beam 1310.

It may be important for metallization pads 2620 and 2630 to be wider in extent than the plated indium layers 2820 and 2830. The excess area may allow the indium to flow outward somewhat upon melting, without escaping the bond region, while simultaneously providing for the necessary Au/In ratios cited above.

Figure 31:
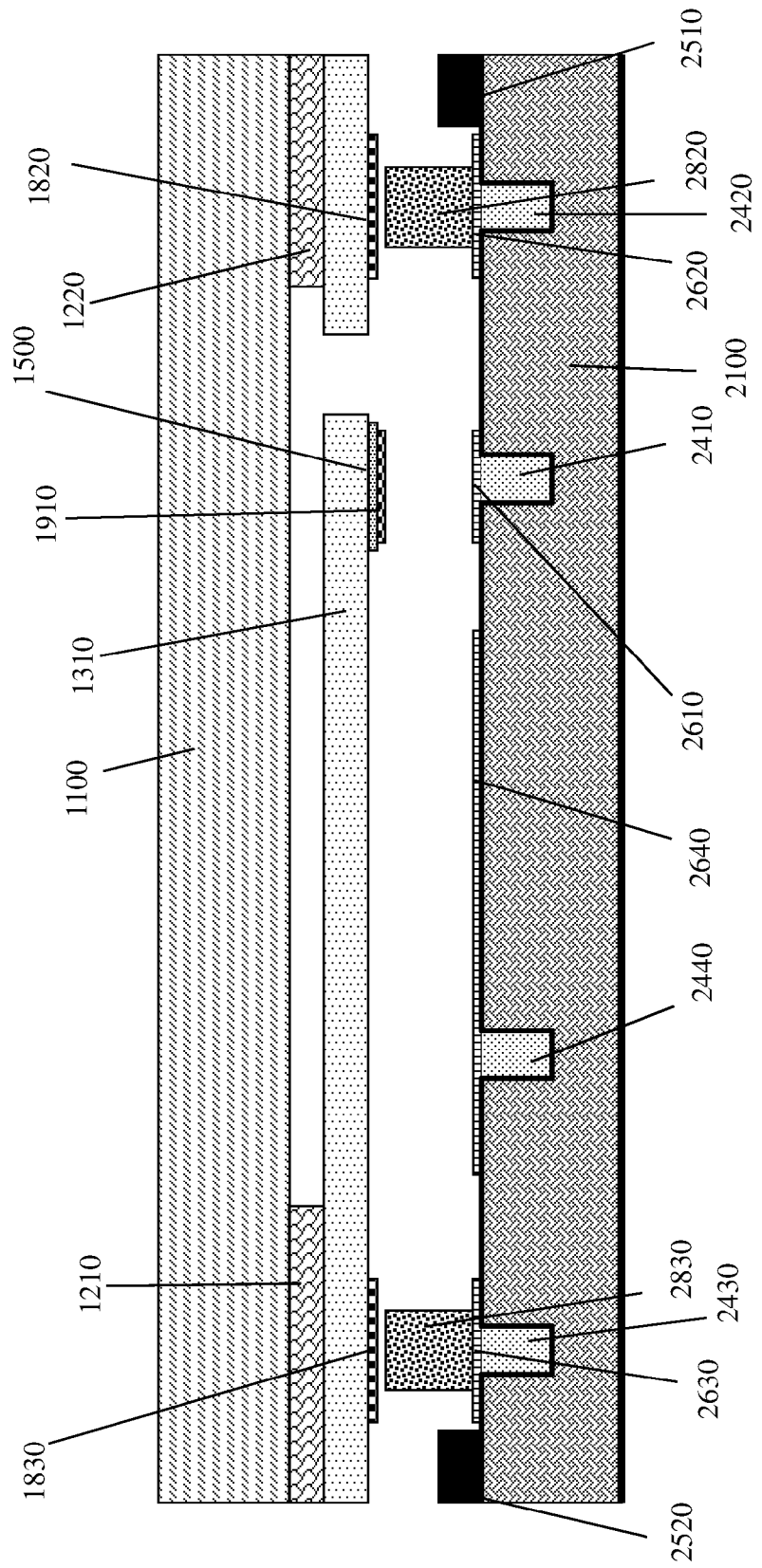
FIG. 31 is a cross sectional view of the dual substrates before bonding.

The two portions, the cantilevered beam portion 1000 and the electrical contacts portion 2000 are now ready to be assembled to form the dual substrate electrostatic MEMS switch 100. The two portions may be first aligned as shown in FIG. 31, such that the metallization layers 1820 and 1830 of the cantilevered portion 1000 are registered with the metallization layers 2620 and 2630, respectively. This places the plated indium layer 2820 between metallization layers 2620 and 1820, and plated indium layer 2830 between metallization layers 2630 and 1830.

Methods and techniques for forming the alloy seal are further described in U.S. patent application Ser. No. 11/211,625 (now U.S. Pat. No. 7,582,969), which is incorporated by reference herein in its entirety.

For MEMS switches that benefit from a defined ambient environment, the two portions 1000 and 2000 of the electrostatic MEMS switch 100 may first be placed in a chamber which is evacuated and then filled with the desired gas. For example, for MEMS switches to be used in telephone applications using relatively high voltage signals, the desired gas may be an insulating gas such as sulfur hexafluoride ($SF_6$) or a freon such as $CCl_2F_2$ or $C_2Cl_2F_4$. The insulating gas is then sealed within the dual substrate electrostatic MEMS switch 100 by sealing the cantilever portion 1000 to the electrical contacts portion 2000 with the alloy bond formed by layers 2620, 2820 and 1820 and layers 2630, 2830 and 1830.

To form the alloy bond between layers 2620, 2820 and 1820 and layers 2630, 2830 and 1830, the cantilevered portion 1000 may be applied to the electrical contacts portion 2000 under pressure and at elevated temperature. For example, the pressure applied between the cantilevered portion 1000 and the electrical contacts portion 2000 may be from 0.5 to 2.0 atmospheres, and at an elevated temperature of about 180 degrees centigrade. This temperature exceeds the melting point of the indium (157 degrees centigrade), such that the indium flows into and forms an alloy with the gold. As mentioned above, the stoichiometry of the alloy may be 2 indium atoms per one gold atom, to form $AuIn_2$. In contrast to the low melting point of the indium metal, the melting point of the alloy is 541 degrees centigrade. Therefore, although the alloy is formed at a relatively low temperature, the durability of the alloy bond is outstanding even at several hundred degrees centigrade. The bond is therefore compatible with processes which deposit vulnerable materials, such as metals, on the surfaces and in the devices. These vulnerable materials may not be able to survive temperatures in excess of about 200 degrees centigrade, without volatilizing or evaporating.

Upon exceeding the melting point of the indium, the indium layers 2820 and 2830 flow outward, and the cantilevered portion 1000 and the electrical contacts portion 2000 are pushed together, until their approach is stopped by the polymer standoffs 2510 and 2520. As the alloy forms, it may immediately solidify, sealing the $SF_6$ environment in the dual substrate electrostatic MEMS switch 100.

While the systems and methods described here use a gold/indium alloy to seal the MEMS switch, it should be understood that the dual substrate electrostatic MEMS switch 100 may use any of a number of alternative sealing methodologies, including different constituent metals for the bond line and cross-linked polymers. For example, the seal may also be formed using a low-outgassing epoxy which is impermeable to the insulating gas.

In another alternative, a gold-gold thermocompression bond may be used to bond the two substrates. In this technique, two gold surfaces are pressed together and the temperature is raised until atoms migrate from one crystal lattice to the other one based on crystal lattice vibration. This atomic interaction adheres the two surfaces together. A temperature on the order of 260 degrees centigrade is generally sufficient.

Figure 32:
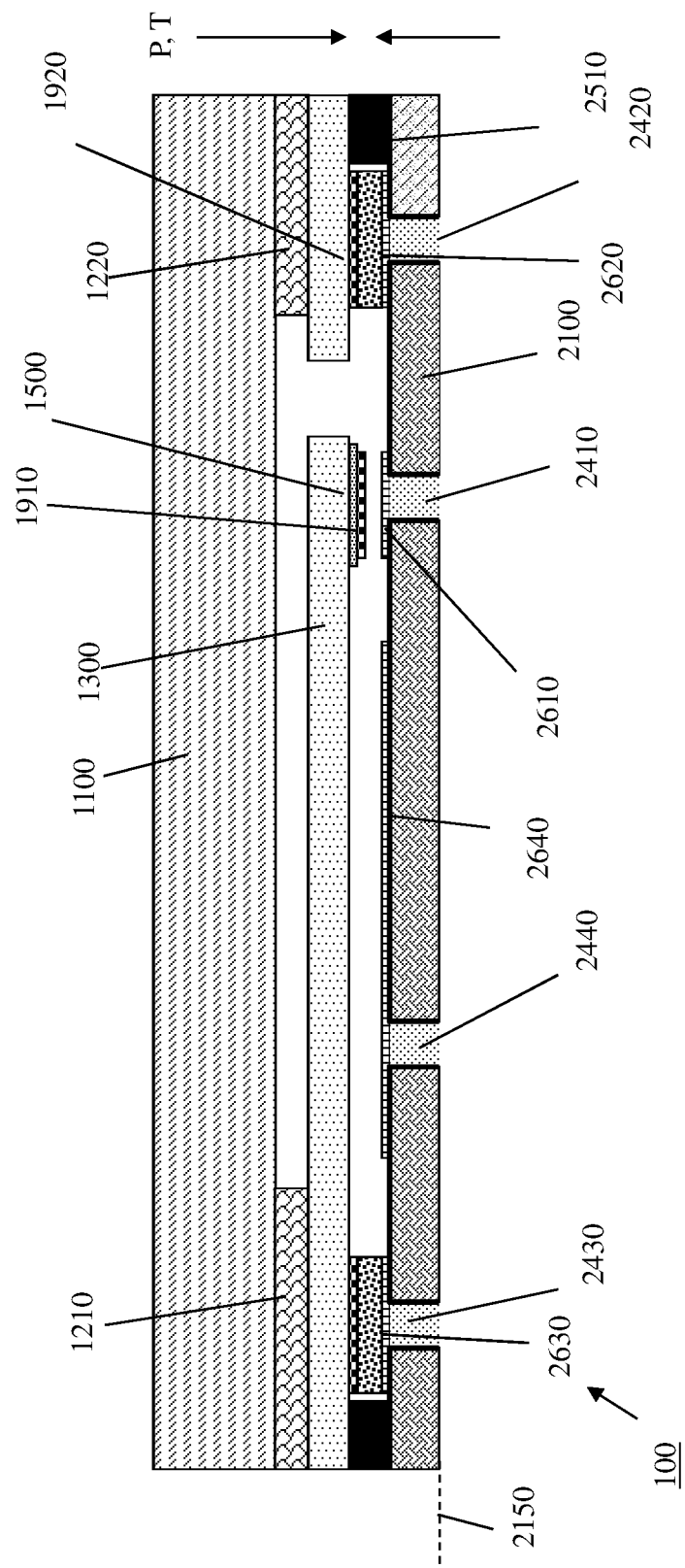
FIG. 32 is a cross sectional view of the dual substrate electrostatic MEMS switch after bonding.

FIG. 32 shows the dual substrate electrostatic MEMS switch 100 after assembly with the alloy bond. In its assembled state, the shunt bar 1910 on the cantilevered beam 1310 overhangs the electrical contacts 2610 and 2610', and the cantilevered beam 1310 overhangs the metallization plate 2640, as shown in FIG. 1. Upon applying appropriate voltages to metallization pads 2630 and 2640, a differential voltage forms across the parallel plate capacitor formed by the cantilevered beam 1310 and the metallization plate 2640, drawing the cantilevered beam 1310 toward the electrostatic metallization plate 2640. At it lower point of travel of the cantilevered beam 1310, the shunt bar 1910 affixed to the end of the cantilevered beam 1310 is applied across the electrical contacts 2610 and 2610' of the switch 100, thereby closing the switch. An input electrical signal applied to one of the electrical contacts 2610 or 2610' may then be obtained as an output electrical signal from the other electrical contact. The switch may be opened by discontinuing the voltages applied to the metallization pads 2630 and 2640, whereupon the switch may return to its original position because of the restoring spring force acting on the stiff beam, for example.

In order to apply the appropriate signals to metallization pads 2610, 2620, 2630 and 2640, electrical access may need to be achieved to vias 2410, 2420, 2430 and 2440. To provide access the vias, material from the backside of substrate 2100 may be removed until the dead-end walls of the blind trenches 2110-2140 have been removed, up to the level indicated by reference number 2150, as shown in FIG. 32. The technique for removing the excess material may be, for example, grinding.

Figure 35:
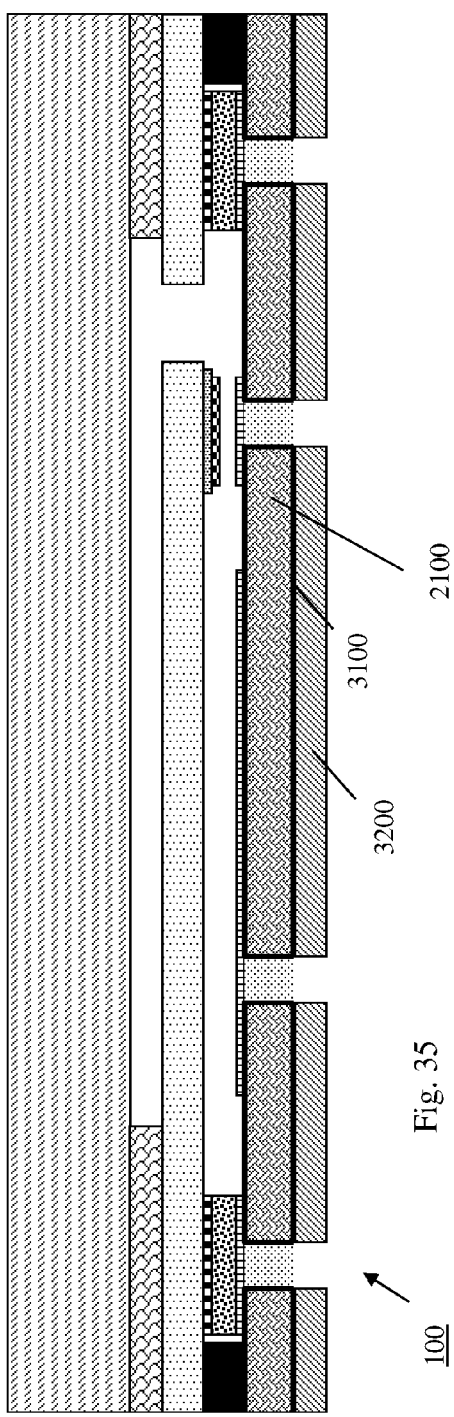
FIG. 35 is a cross sectional view of the dual substrate MEMS switch after etching the oxide layer from the vias.
Figure 36:
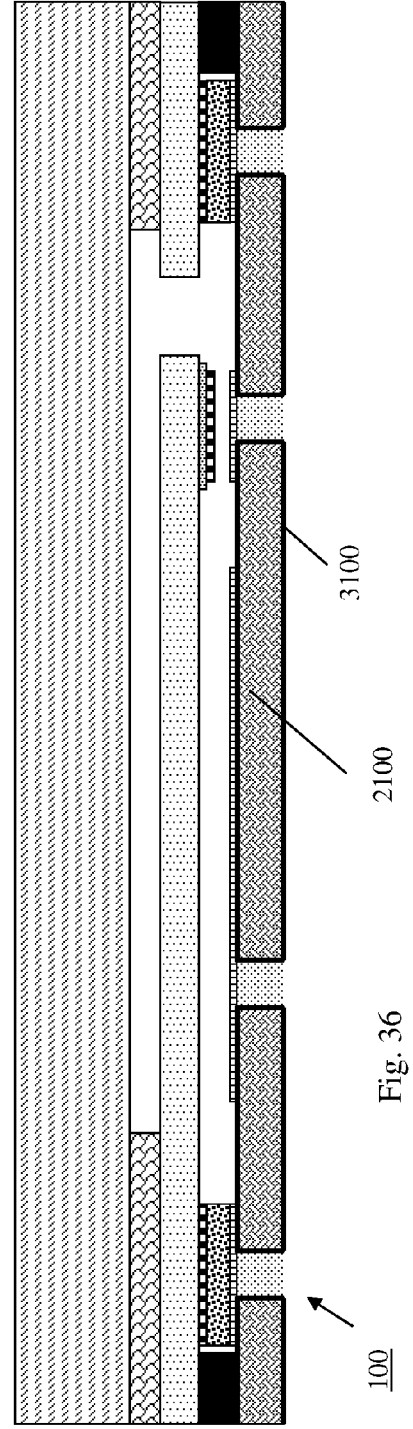
FIG. 36 is a cross sectional view of the dual substrate MEMS switch after removing the photoresist from the substrate.
Figure 37:
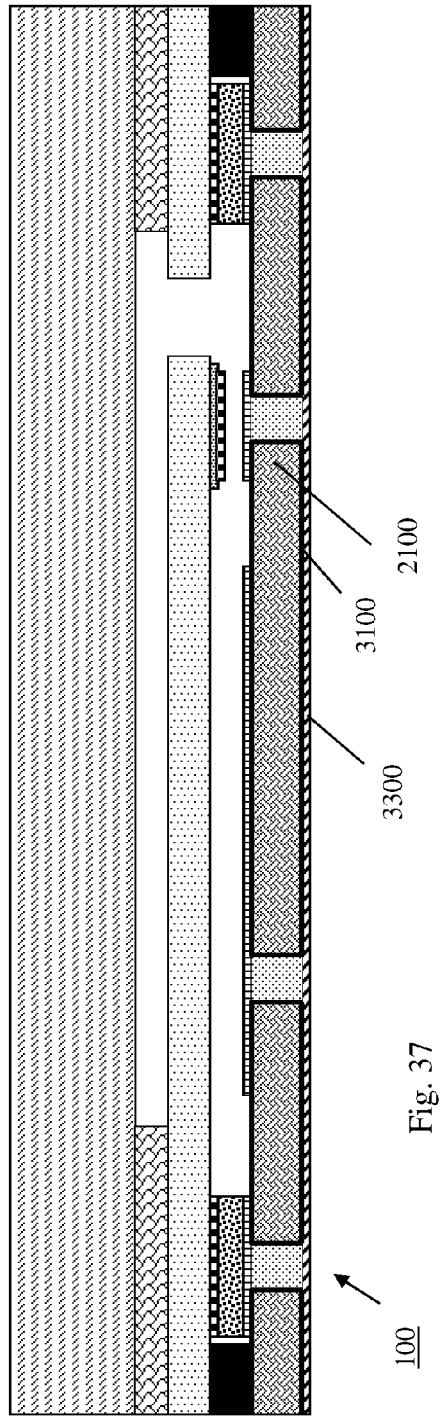
FIG. 37 is a cross sectional view of the dual substrate MEMS switch after depositing the conductive layer on the underside of the dual substrate MEMS switch.
Figure 38:
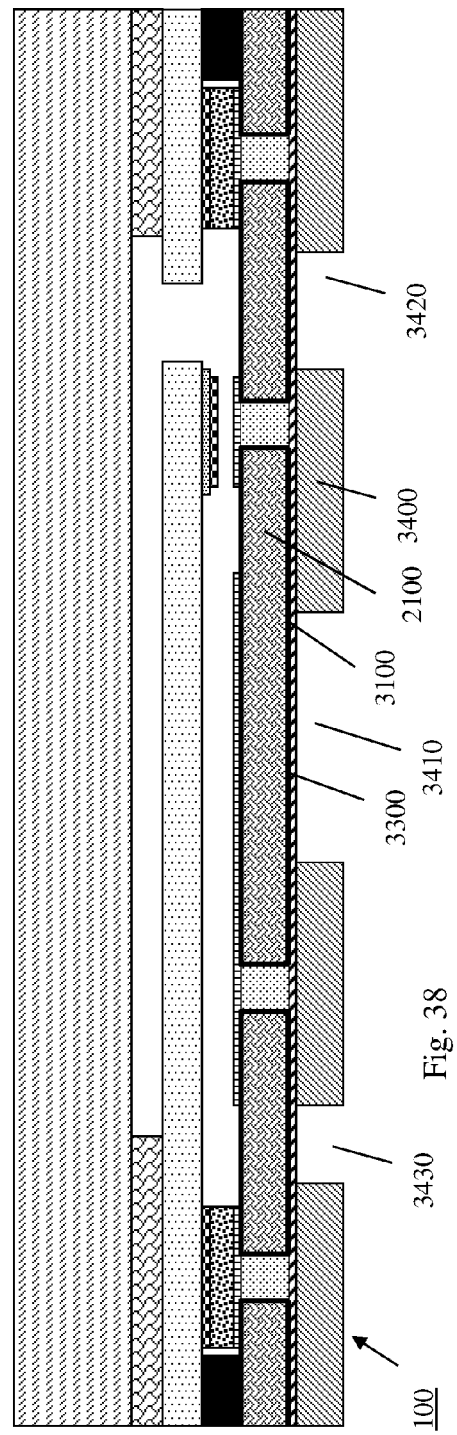
FIG. 38 is a cross sectional view of the dual substrate MEMS switch after depositing and patterning photoresist over the conductive layer.
Figure 39:
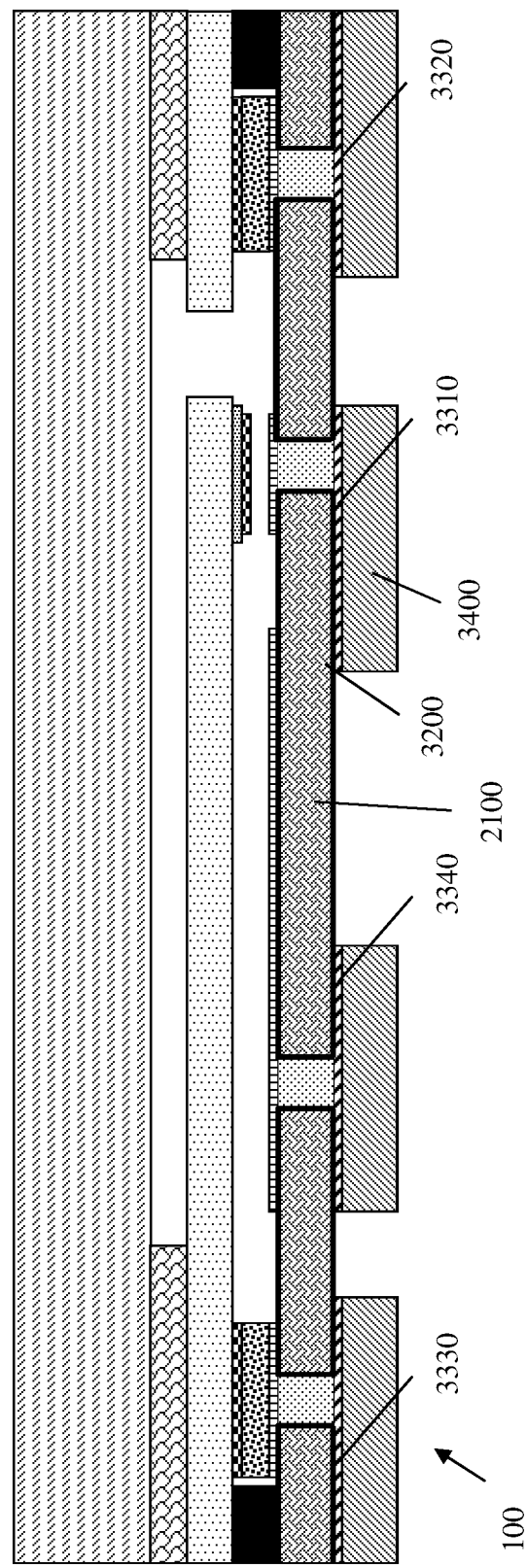
FIG. 39 is a cross sectional view of the dual substrate MEMS switch after etching the conductive layer according to the photoresist pattern.

The lower substrate 2100 may then be coated with an oxide 3100, which may be $SiO_2$, for example, at a thickness sufficient to isolate the vias 2410-2440 one from the other, as shown in FIG. 33. The oxide may be deposited by a low temperature dielectric deposition process, such as sputtering or plasma enhanced chemical vapor deposition (PECVD). The oxide-coated substrate 2100 may then be covered with photoresist 3200 and patterned, as shown in FIG. 34. The substrate 2100 may then be etched through the photoresist 3200 to remove the oxide 3100 from the openings of the vias 2410-2440. The substrate 2100 is shown in FIG. 35. The photoresist 3200 may then be stripped from the substrate 2100, as shown in FIG. 36.

The rear surface of substrate 2100 may then be covered with a conductive layer 3300. In some exemplary embodiments, the conductive layer may be a Cr/Mo/Au multilayer, chosen for the same reasons as multilayers 1900 and 2600, and deposited using the same or similar techniques. Alternatively, the conductive layer 3300 may be any conductive material having acceptable electrical and/or thermal transport characteristics.

The conductive layer 3300 is then covered once more with photoresist 3400, which is also patterned with openings 3410, 3420 and 3430, which correspond to the locations of the contact pads to be formed from the conductive layer 3300. Alternatively, the metal may be deposited through a shadow mask, allowing for the possibility of thicker layers and eliminating the need for further processing.

The conductive layer 3300 on the rear of the substrate 2100 is then etched to remove the conductive layer at the openings of the photoresist 3410, 3420 and 3430, to form isolated conductive pads 3310, 3320, 3330 and 3340. Conductive pad 3310 may provide electrical access to the contact point 2610 of the switch; conductive pad 3320 may provide a redundant ground connection to the SOI device layer; conductive pad 3330 may provide electrical access to the cantilevered beam 1310 through via 2630 and metal alloy bond 2830; and conductive pad 3340 may provide electrical access to the electrostatic plate 2640.

Exemplary thicknesses of various layers of the dual substrate electrostatic MEMS switch 100 are shown in FIG.

Figure 40:
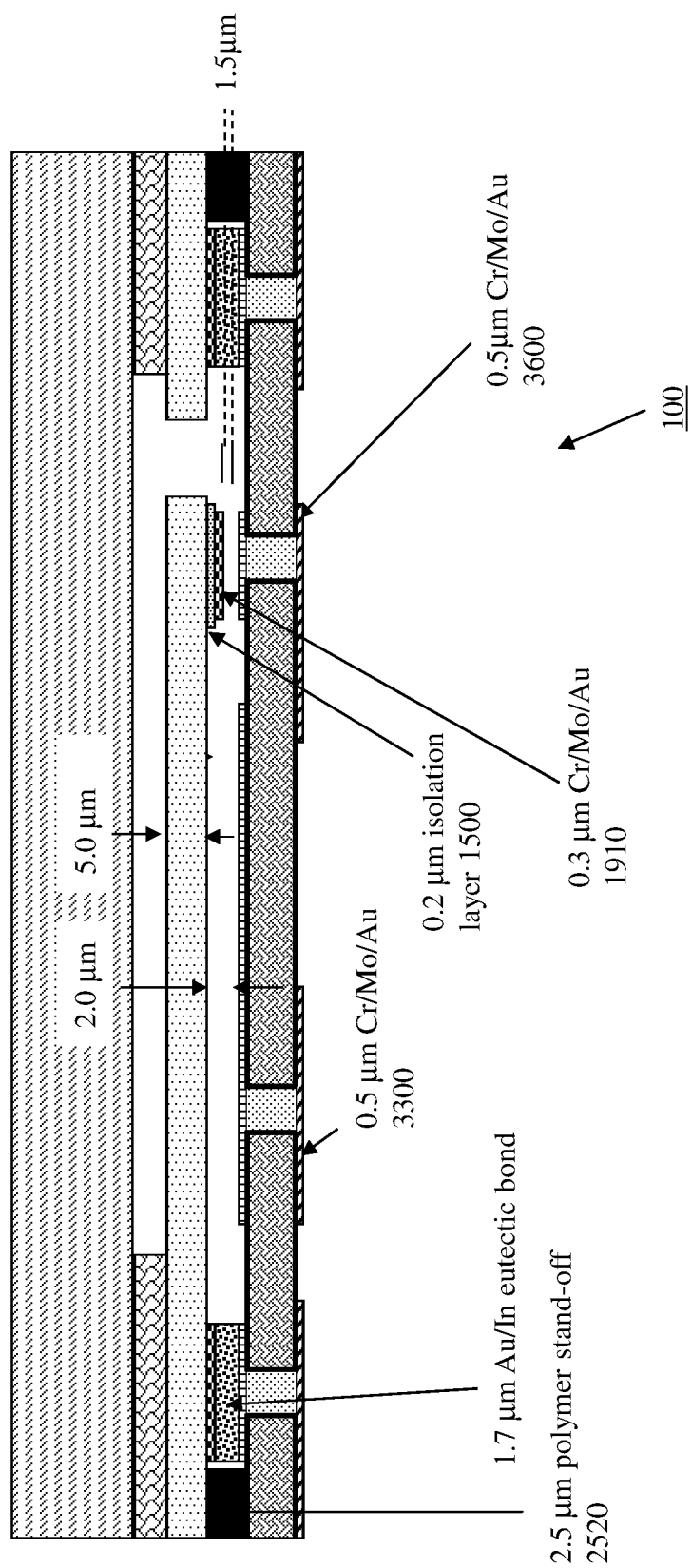
FIG. 40 is a cross sectional view of the finished dual substrate MEMS switch.

40. As shown in FIG. 40, an exemplary thickness of the Cr/Mo/Au conductive layer 3600 is about 0.5 µm. An exemplary distance between the lower surface of the shunt bar 1910 and the upper surface of the contact point 2610, also defined as the throw of the switch, may be, for example, about 1.5 µm. An exemplary thickness of the conductive material of the shunt bar 1910 may be, for example, about 0.3 µm. An exemplary thickness of the alloy bond (In material as well as Cr/Mo/Au multilayers) may be about 1.7 µm. An exemplary thickness of the cantilevered beam 1310 may be about 5.0 µm, which may also be the thickness of the device layer 1300. An exemplary thickness of the isolation layer 1500 may be 0.2 µm. Finally, an exemplary thickness of the polymer standoff 2520 may be about 2.5 µm, which also defines the separation between the cantilevered portion 1000 and the electrical contacts portion 2000, of the dual substrate electrostatic MEMS switch 100.

Although structure 1310 has been referred to throughout as a cantilever beam 1310, it is helpful for the purposes of this disclosure to acknowledge that structure 1310 is two dimensional. That is, cantilevered beam 1310 may also be characterized as a cantilevered plate 1310. The two-dimensional nature of cantilevered plate 1310 will become evident in the discussion which follows. Furthermore, a switch may also be made using a multiply attached deformable plate, rather than a cantilevered one. A multiply-attached plate switch using such a deformable member is discussed in detail in U.S. Pat. No. 7,893,798 issued Feb. 22, 2011 and incorporated by reference in its entirety. As will become apparent in the discussion below, the multilply-hinged cantilevered plate may have performance advantaged over both the cantilevered beam and the deformable plate.

Figure 41:
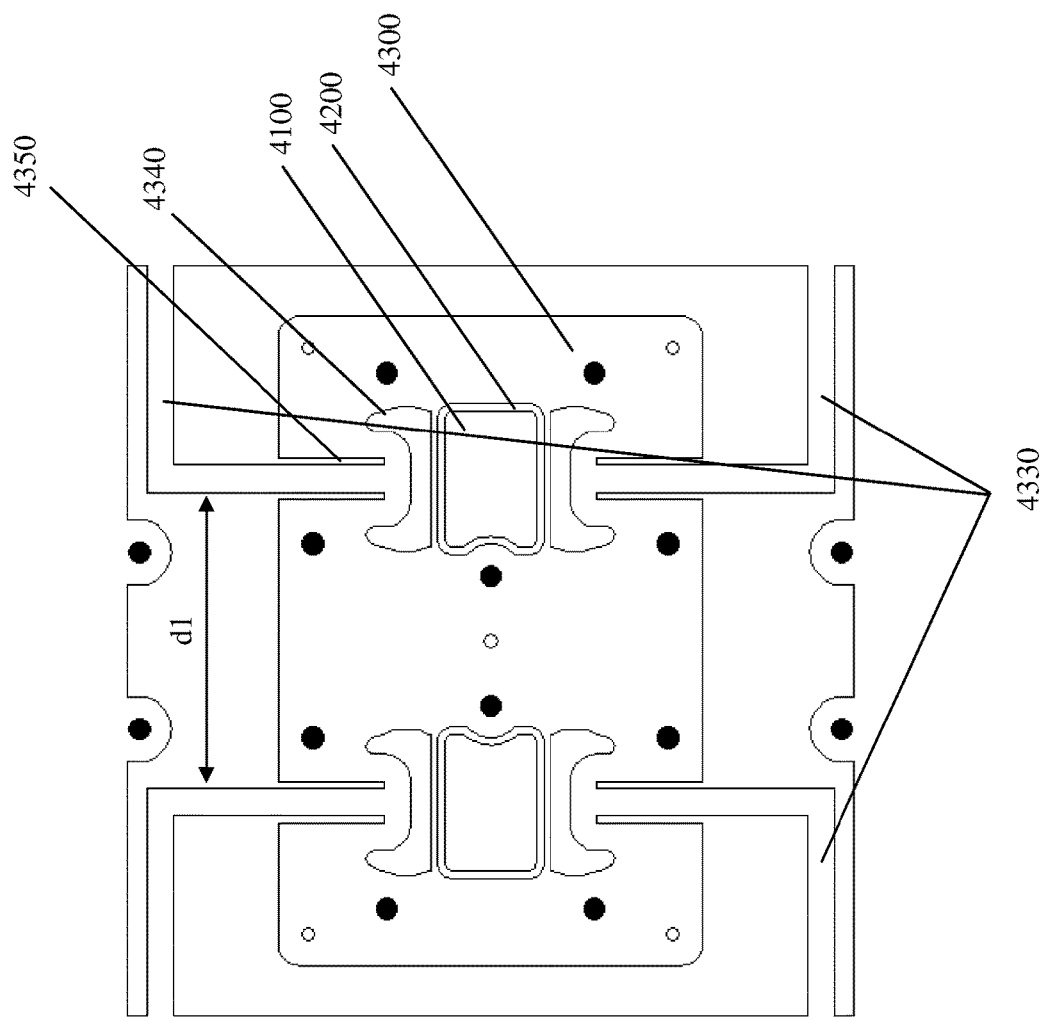
FIG. 41 is a conceptual diagram of a deformable plate MEMS switch.

FIG. 41 is a plan view of a layout of an exemplary deformable plate 4300, showing additional detail of the embodiment. In particular, spring beams 4330 are formed with cutouts 4350 which penetrate the deformable plate 4300. The deformable plate may also have relieved areas 4340 formed near the locations of the shunt bars 4100. Both the cutouts 4350 and the relieved areas 4340 give the deformable plate additional flexibility in the area of the junction with the spring beams 4330. This may help decouple the motion of the plate 4300 from the deflection of the spring beams 4330. These features 4350 and 4340 may also help the deformable plate 1300 to close the switch effectively, in the event that the contacts are recessed somewhat from the surface of the via substrate 2000, by giving the deformable plate 1300 additional flexibility in the region around the shunt bars 4200.

Deformable plate 4300 as well as the cantilevered beam 1310 described above may be made from the device layer of the SOI plate substrate 1000, and it may be made highly resistive, of the order 20 ohm-cm. This resistivity may be sufficient to carry the actuation voltage of about 40 volts, but may too high to support the higher frequency alternating current voltages associated with the first vibrational mode at about 73 kHz. Accordingly, the resistivity may electrically dampen capacitive plate vibrations, especially the whole-body first mode plate vibration.

The deformable plate switch design illustrated in FIG. 41 may have a number of advantages over cantilevered switch designs, wherein the switch contacts are disposed at the end of a cantilevered beam. For example, as described above, multiple sets of switch contacts may be provided along a deformable plate, thereby reducing the overall switch resistance and therefore the loss across the switch. The multiple switch contacts also provide redundancy, such that the switch may still be useable even if one set of switch contacts fails. These design options are generally not available in a cantilevered switch design, because the contacts are necessarily placed at the distal end of the cantilevered beam.

In addition, the electrostatic deformable plate switch 100 may be made more compact than a cantilevered switch, because a long length of cantilevered beam is not required to have a sufficiently flexible member to actuate with modest voltages. For example, the plate design illustrated in FIG. 41 may be actuated with only 40 volts, because the spring beams 4330 which support the deformable plate may be made relatively flexible, without impacting the spacing between the electrical contacts.

The electrical contacts such as electrostatic plate 2640 may actually be a multilayer comprising first a thin layer of titanium (Ti) about followed by a layer of ti/tungsten alloy (80% tungsten, 20% titanium) followed by a thicker layer of gold (Au), and finally a layer of ruthenium dioxide, $RuO_2$. The titanium may be an adhesion layer, and the Ti/Tu layer may be a diffusion barrier between the Ti and the Au. The Ti/Tu barrier layer may prevent the diffusion of Ti into the Au, which would otherwise dramatically increase the resistance of the Au. The layer thicknesses may be about 10-50 nm Ti, 10-100 nm Ti/Tu, 0.5-2 microns of gold (Au), and 50-150 nm $RuO_2$. The layers may be formed by ion beam deposition (IBD) or reactive ion sputtering, for example.

So, upon consideration of the cantilevered architectures described above, the movable portion moves about the hinge attachment point to the substrate, toward a lower electrode on a second substrate. The cantilevered beam 1310 is attracted electrostatically to plate 2640, causing the beam 1310 to bend at hinge point 3160. The cantilevered, movable beam may result from a first void 3100 formed generally around the periphery of the plate 1300 or 4300. If the moving member of the switch is a cantilevered beam or plate, wherein the moving member has significant stiffness, this hinge movement may result in a corner of the contacts hitting before the faces touch. The situation is shown conceptually in FIG. 42. The amount of deflection may be a function of the distance to the attachments point, as is well known form beam bending physics. The resulting curvature may be parabolic, as shown qualitatively in FIG. 42.

As a result of this bending, there will be an angle in the cantilevered plate 1310 that causes the contact 1910 to have an angle with respect to contact 2610. Accordingly, the corner of contact 1910 is likely to touch first contact 2610, rather than the face of contact 1910. Because the small corner touches first, pressures can be substantial and corners may wear. Furthermore, if the voltage is increased further in order to increase the contact force, the distal end of the cantilever may touch the lower surface, thus shorting the voltage or preventing further movement of the beam or plate. Thus, the contact area, contact pressure, stiction, and other mechanical effects can be highly variable. Most applications benefit from a stable and reliable contact resistance. This cantilevered switch may suffer in terms of long term reliability and repeatability for this reason.

Figure 43:
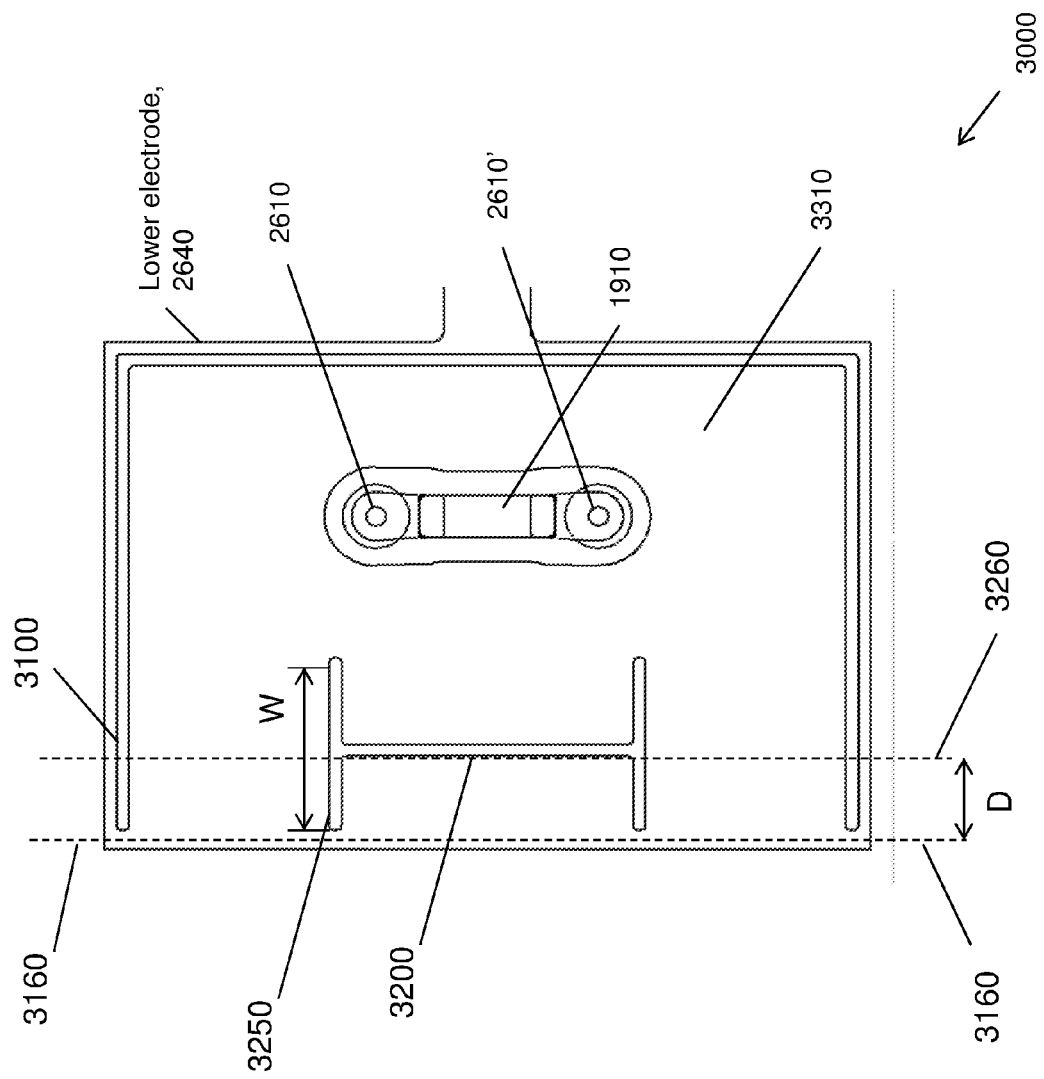
FIG. 43 is a plan view of a multiply-hinged dual substrate MEMS switch.

A solution to this problem may be the dual substrate electrostatic MEMS switch with multiple hinge point cantilever. A simplified drawing of this device is shown in FIG. 43. As with previous embodiments, a first beam cut 3100 forms the primary hinge, and forming hinge point 3160 in FIG. 43. This first cut 3100 also forms the cantilevered plate 3310. Upon application of a voltage differential between a lower electrode 2640, and the multiply hinged cantilevered beam 3310, the multiply hinged cantilevered beam 3310 will be drawn toward the lower electrode until a shunt bar 1910 makes an electrical connection between two pads 2610. In general, these pads 2610 sit atop a set of through substrate vias, such that a voltage or signal applied to one pad 2610 will appear on the other pad 2610' when the switch is closed. Accordingly, the MEMS switch may further comprise a shunt bar which electrically connects two electrical contacts formed on the second substrate when the electrostatic MEMS switch is closed, wherein the shunt bar is electrically isolated from other portions of the cantilevered beam.

However, in this embodiment, a second cut 3200 may form a secondary hinge 3260 in cantilevered plate 3310, which is spaced laterally from the primary hinge 3160. If the beam or plate has a proximal end defined by the first hinge or attachment point 3160 that attaches it to the substrate, and a distal end that is not attached, the multiply hinged cantilevered beam may have at least one additional hinge disposed adjacent the first hinge in the distal direction. This secondary hinge 3260 may result from a void or cut formed in the material of the movable plate or beam, rather than at an attachment point to the substrate. The lateral distance D between the hinges may be about 25-35 microns. Because of cut 3200, the plate will bend about the point 3160 as before, however because of the second cut 3200, it will now also bend about a second hinge point 3260. These two angles may oppose one another, and as a result, multiply hinged cantilevered plate 3310 may approach the bottom contact 2610 with a much flatter attitude. Contact 1910 may therefore approach contact 2610 with their respective faces far more parallel than in the previous case shown in FIG. 42.

Figure 44:
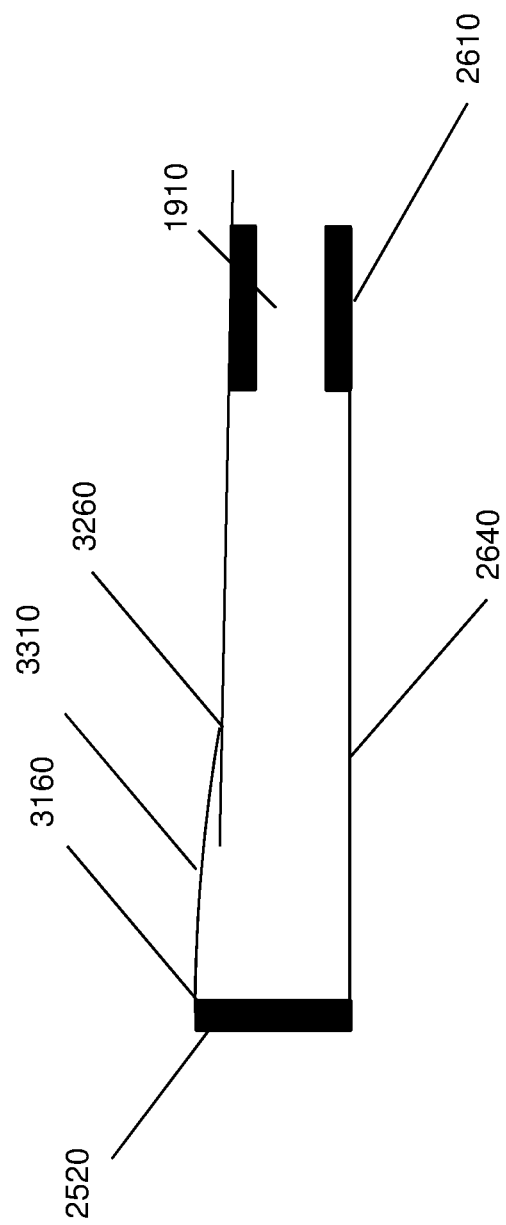
FIG. 44 is a conceptual diagram of a single hinged dual substrate MEMS switch.

The situation is shown conceptually in FIG. 44. FIG. 44 is a simplified illustration of the multiply hinged cantilevered beam or plate 3310 with two cantilevered hinges 3160 and 3260. Because of the double hinges, the multiply hinged cantilevered beam or plate 3310 has a flatter attitude as it is drawn towards lower electrode 2640. As a result, contact 1910 tends to approach lower contact 2610 with a flatter attitude.

The removal of material in the region shown as 3200 will result in less mechanical stiffness, i.e. greater flexibility of the plate in this region. Thus, second cut region 3200 defines a second hinge or second cantilever point. The double cantilever design therefore entails a plurality of cuts or removal of substrate material, resulting in a plurality of hinge or cantilevered structures, such that the structure bends about these cuts or removals. The shapes, cuts, voids and outlines in the multiply-hinged cantilevered switch 3000 may be formed by photolithography and deep reactive ion etching (DRIE) as described above with respect to cantilevered switch 100. As with deformable plate 4300, the cantilevered beam 1310, the multiply-hinged cantilevered beam 3310 may be made from the device layer of the SOI plate substrate 1000. When mated with a second substrate having a lower electrostatic plate, the switch is formed.

Accordingly, an electrostatic MEMS switch may include a movable, cantilevered plate affixed on one side to a first substrate along a line of attachment at a proximal end, wherein the plate bends about a first hinge line along the line of attachment, wherein the cantilevered plate is movable as a result of a first void 3100 formed generally around a perimeter of the movable plate. The multiply hinged plate switch may further include a second void 3200 formed in the movable plate, and wherein the plate also bends about a second hinge line as a result of the second void made in the movable plate, wherein the second hinge line is further away from the proximal end than the first hinge line.

The cantilevered plate may be formed in a first substrate 1000 and the lower plate electrode may be formed in a second substrate 2000 as described above with respect to previous embodiments. The first substrate may be a silicon-on-insulator substrate including a device layer, a handle wafer and an insulating oxide layer between the device layer and the handle wafer, and the second substrate may be at least one of a silicon substrate and a silicon-on-insulator substrate. In this case, the cantilevered plate may be formed from the device layer of the silicon-on-insulator substrate, and affixed to the handle wafer of the silicon-on-insulator substrate by the oxide layer, except where this oxide layer has been removed under and around the first void.

The electrostatic MEMS switch may further include at least one electrical contact formed on a second substrate; and a hermetic seal which couples the first substrate to the second substrate, and seals the MEMS switch. The electrical contact may have the multilayer architecture described above. Such contacts may include the lower plate 2640 and the shunt bar 1910.

Figure 42:
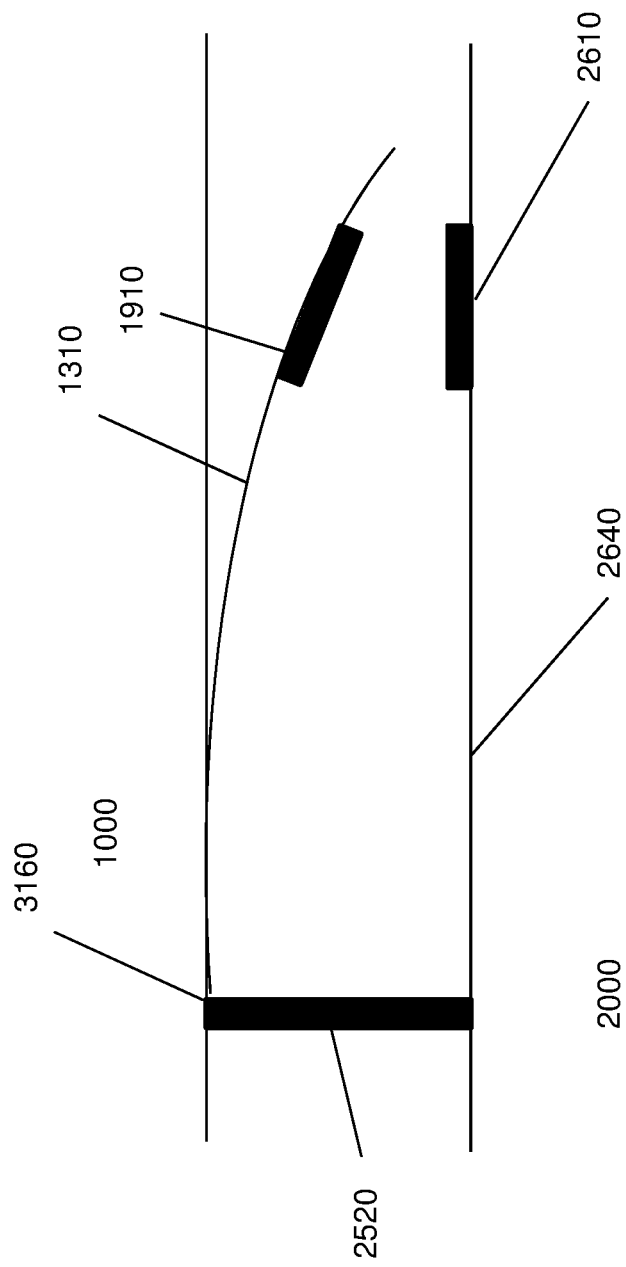
FIG. 42 is a conceptual diagram of a single hinged dual substrate MEMS switch.
Figure 45C:
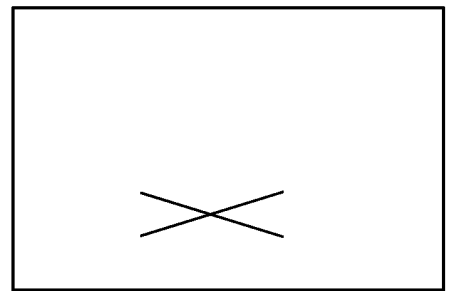
FIG. 45b and FIG. 45C are a conceptual diagrams of a alternative embodiments of a multiply-hinged dual substrate MEMS switch.
Figure 45B:
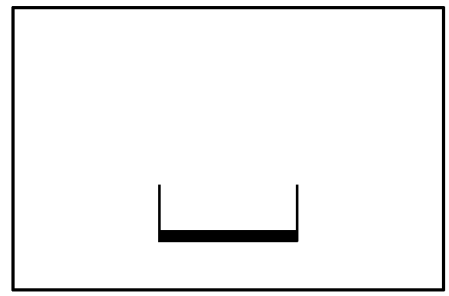
Figure 45A:
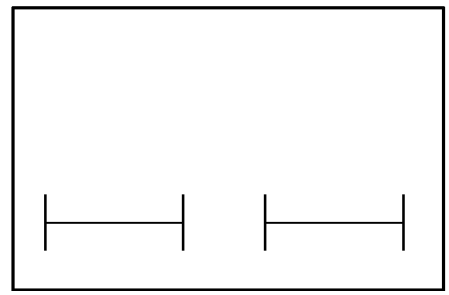

The second void or cut 3200 may have other features which can adjust or determine the stiffness of the hinge 3200 in the same or other dimensions. Additional cuts or removals may determine the final flexure and shape of multiply hinged cantilevered plate 3310. For example, an orthogonal cut 3250 is shown in FIG. 42, such that the void has the shape of the letter H or I. The width W of this cut may be on the order of about 50-60 microns. The removal of this material may give the multiply hinged cantilevered plate more torsional flexibility, and thus able to accommodate some out-of-plane deviations of the face of upper contact 1910 with respect to lower contact 2610. It should be understood that the features shown in FIG. 42 are exemplary only, and that these details are not limiting to the invention. Any number of additional cuts may be made in multiply hinged cantilevered plate 3310, in order to achieve various goals as to its mechanical and kinematic performance It may be important to combine one void which is generally parallel with the first hinge line (3200 is generally parallel with 3150) with another void which is perpendicular to the first (3250 is perpendicular to 3200). There are various shapes which can accomplish this purpose, some of which are shown in FIGS. 45*a-c*. Having the perpendicular void may allow the flexure shown in FIG. 44.

It should be understood that the shape of void 3200 and 3250 shown in FIG. 43 is exemplary only, and that the additional one or more voids may have alternative designs, depending on the requirements of the application. There may be a plurality of like voids as shown in FIG. 45*a*. Or the void may have alternative shapes such as a "U" or "C" (FIG. 45*b*) or "X" (FIG. 45*c*). A simple line, "I" may also be used. This list is not meant to be exhaustive, but only to demonstrate that the additional voids may be formed in a wide variety of shapes. As a result of the presence of the one or more voids, the movable cantilever or plate may bend around at least one additional hinge or line.

Figure 46:
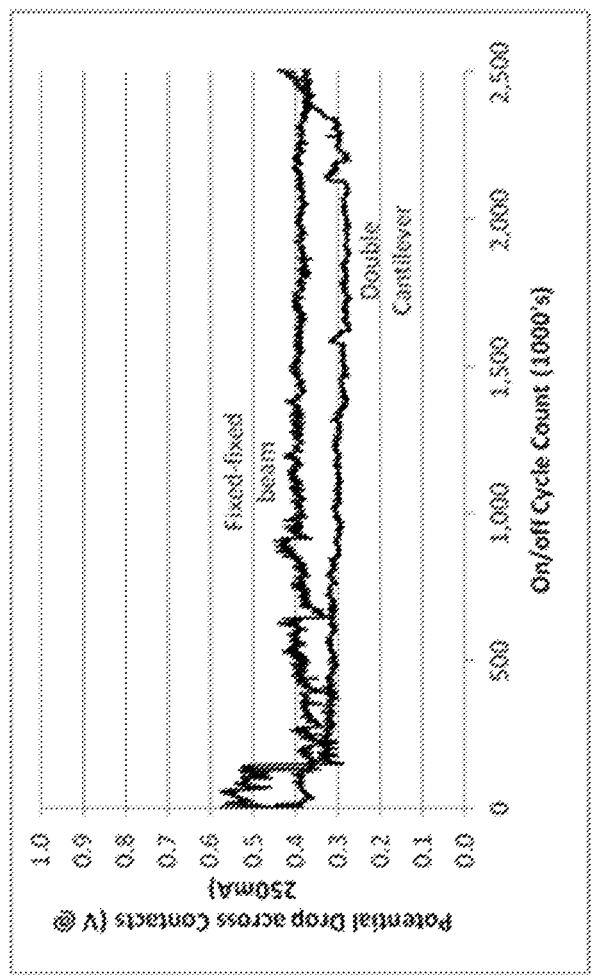
FIG. 46 is a plot of the voltage drop across a multiply hinged vs deformable plate MEMS switch.

The improved performance of the multiply hinged cantilevered switch 3000 is demonstrated in FIG. 46. FIG. 46 is a plot of the voltage drop across contacts 1910 and 2610 as a function of number of on/off cycles for two designs. The first design is a deformable plate switch such as that shown in FIG. 41. The second design is a multiply hinged cantilevered beam switch 3000 as shown in FIG. 43. The voltage drop may be related to the contact resistance, and is thus a well-known figure of merit for switches.

The upper curve is the voltage drop across the deformable plate switch, which shows a voltage drop of around 0.4V at 250 mA over about 2.5M cycles. The lower curve is the voltage drop for a multiply hinged cantilevered beam, and shows a somewhat lower voltage drop of around 0.3V. As can be seen from the plot, the multiply hinged cantilevered switch 3000 has a generally lower voltage drop, and thus lower contact resistance, than the single cantilevered switch 100.

The voltage drop for multiply hinged cantilevered beam switch 3000 also varies within a smaller range, that is, the level of the contact resistance has a more repeatable value. Accordingly, its contact resistance is lower and less variable than the single cantilevered switch 100. It is conjectured that this improved performance is a result of the more uniform pressure on the contacts, over a larger area, of the multiply hinged cantilevered switch 3000 compared to the deformable plate. The multiply hinged cantilever is also a more constrained system, than the deformable plate shown in FIG. 41. The deformable plate has several modes of movement, including pitch and yaw. As a result, the details of the contact made between the electrodes may vary over a wider range for each open/closed cycle.

A method for manufacturing the electrostatic MEMS switch has been described in detail above. The manufacturing techniques may be applied to the following steps: 1) forming a movable, cantilevered plate affixed on one side to a first substrate along a line of attachment at a proximal end, wherein the plate bends about a first hinge line along the line of attachment; and 2) forming at least a second hinge line as a result of at least a second void made in the plate, wherein the second hinge line is further away from the proximal end than the first hinge line. The method may further comprise 3) forming at least one electrical contact on a second substrate; and 4) coupling the first substrate to the second substrate with a hermetic seal that seals the MEMS switch; and 5) forming an electrostatic conductive plate on the second substrate; and 6) forming electrical vias through a thickness of the second substrate. Various methods of forming a hermetic seal are described above, and include a Au/In alloy bond and a gold-gold thermocompression bond.

While various details have been described in conjunction with the exemplary implementations outlined above, various alternatives, modifications, variations, improvements, and/or substantial equivalents, whether known or that are or may be presently unforeseen, may become apparent upon reviewing the foregoing disclosure. For example, while the disclosure describes a number of fabrication steps and exemplary thicknesses for the layers included in the MEMS switch, it should be understood that these details are exemplary only, and that the systems and methods disclosed here may be applied to any number of alternative MEMS or non-MEMS devices. Accordingly, the exemplary implementations set forth above, are intended to be illustrative, not limiting.

What is claimed is:

1. An electrostatic MEMS switch, comprising:
a movable, cantilevered plate affixed on one side to a first substrate along a line of attachment at a proximal end, wherein the plate bends about a first hinge line along the line of attachment, wherein the cantilevered plate is movable as a result of a first void formed generally around a perimeter of the movable plate;
a second void formed in the movable plate, and wherein the plate also bends about a second hinge line as a result of the second void made in the movable plate, wherein the second hinge line is further away from the proximal end than the first hinge line.

2. The electrostatic MEMS switch of claim 1, further comprising:
at least one electrical contact formed on a second substrate; and
a hermetic seal which couples the first substrate to the second substrate, and seals the MEMS switch.

3. The electrostatic MEMS switch of claim 1, wherein the first substrate is a silicon-on-insulator substrate including a device layer, a handle wafer and an insulating oxide layer between the device layer and the handle wafer, and the second substrate is at least one of a silicon substrate and a silicon-on-insulator substrate.

4. The electrostatic MEMS switch of claim 1, wherein the second void has a portion parallel to the first hinge line, and another portion perpendicular to the first hinge line.

5. The electrostatic MEMS switch of claim 1, further comprising:
an electrostatic conductive plate formed on the second substrate.

6. The electrostatic MEMS switch of claim 1, wherein the second void is in the shape of a straight line, C, U, I or H.

7. The electrostatic MEMS switch of claim 1, wherein the at least on electrical contact comprises a layer of tungsten/gold alloy, a layer of gold, and a layer of ruthenium dioxide.

8. The electrostatic MEMS switch of claim 1, wherein the hermetic seal comprises:
a gold/indium alloy which bonds the first substrate to the second substrate.

9. The electrostatic MEMS switch of claim 1, wherein the cantilevered plate is formed from the device layer of the silicon-on-insulator substrate, and affixed to the handle wafer of the silicon-on-insulator substrate by the oxide layer.

10. The electrostatic MEMS switch of claim 1, wherein the cantilevered plate further comprises a shunt bar which electrically connects two electrical contacts formed on the second substrate when the electrostatic MEMS switch is closed, wherein the shunt bar is electrically isolated from other portions of the cantilevered beam.

11. The electrostatic MEMS switch of claim 1, wherein the first substrate is coupled to the second substrate with a gold-gold thermocompression bond.

* * * * *